(12) United States Patent
Lee et al.

(10) Patent No.: US 9,817,309 B2
(45) Date of Patent: Nov. 14, 2017

(54) PHOTOMASKS, METHODS OF FABRICATING THE PHOTOMASKS, AND METHOD OF FABRICATING SEMICONDUCTOR DEVICES BY USING THE PHOTOMASKS

(71) Applicants: Jung-hwan Lee, Hwaseong-si (KR); Byung-gook Kim, Seoul (KR); Sang-hyeon Lee, Hwaseong-si (KR)

(72) Inventors: Jung-hwan Lee, Hwaseong-si (KR); Byung-gook Kim, Seoul (KR); Sang-hyeon Lee, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 154 days.

(21) Appl. No.: 14/700,175

(22) Filed: Apr. 30, 2015

(65) Prior Publication Data
US 2016/0048073 A1 Feb. 18, 2016

(30) Foreign Application Priority Data

Aug. 14, 2014 (KR) ........................ 10-2014-0106225

(51) Int. Cl.
*G03F 1/72* (2012.01)
*G03F 1/74* (2012.01)

(52) U.S. Cl.
CPC . *G03F 1/74* (2013.01); *G03F 1/72* (2013.01)

(58) Field of Classification Search
CPC .................................... G03F 1/72; G03F 1/74
USPC ............................................................. 430/5
See application file for complete search history.

(56) References Cited

U.S. PATENT DOCUMENTS

| | | | |
|---|---|---|---|
| 6,190,836 B1 | 2/2001 | Grenon et al. | |
| 6,235,434 B1 | 5/2001 | Sweeney et al. | |
| 6,335,129 B1 | 1/2002 | Asano et al. | |
| 6,368,753 B1 | 4/2002 | Harriott et al. | |
| 7,504,182 B2 | 3/2009 | Stewart et al. | |
| 7,727,681 B2 | 6/2010 | Stewart et al. | |
| 7,745,068 B2 | 6/2010 | Jung et al. | |
| 7,745,072 B2 | 6/2010 | Jung et al. | |
| 7,901,844 B2 * | 3/2011 | Ha | G03F 1/26 430/5 |
| 7,901,849 B2 * | 3/2011 | Ha | G03F 1/38 430/5 |
| 7,914,951 B2 * | 3/2011 | Shin | G03F 1/72 430/5 |
| 7,927,769 B2 | 4/2011 | Hagiwara et al. | |
| 8,344,286 B2 | 1/2013 | Longo et al. | |
| 2003/0000921 A1 | 1/2003 | Liang et al. | |
| 2012/0238096 A1 | 9/2012 | Xiong et al. | |
| 2012/0273458 A1 | 11/2012 | Bret et al. | |
| 2013/0126728 A1 | 5/2013 | Waiblinger et al. | |

FOREIGN PATENT DOCUMENTS

KR 10-0734318 B1 6/2007

* cited by examiner

*Primary Examiner* — Christopher Young
(74) *Attorney, Agent, or Firm* — Myers Bigel, P.A.

(57) ABSTRACT

Provided are photomasks, methods of fabricating the photomasks, and methods of fabricating a semiconductor device by using the photomasks, in which a critical dimension (CD) of a pattern of a specific region of the photomask is corrected to improve the distribution of CDs of the pattern formed on a wafer. The photomasks may include a substrate and a light-blocking pattern formed on the substrate that includes an absorber layer and an anti-reflection coating (ARC) layer. The light-blocking pattern may include at least one of a first corrected area in which a top surface of the absorber layer is exposed, and a second corrected area in which a correction layer is formed on the ARC layer.

20 Claims, 27 Drawing Sheets

PHOTOMASKS, METHODS OF FABRICATING THE PHOTOMASKS, AND METHOD OF FABRICATING SEMICONDUCTOR DEVICES BY USING THE PHOTOMASKS

CROSS-REFERENCE TO RELATED APPLICATION

This U.S. non-provisional application claims priority under 35 U.S.C. §119 to Korean Patent Application No. 10-2014-0106225, filed on Aug. 14, 2014, in the Korean Intellectual Property Office, the disclosure of which is incorporated by reference herein in its entirety.

BACKGROUND

The inventive concept relates to photomasks, and more particularly, to photomasks and methods of fabricating the photomasks, which may improve the dispersion of critical dimensions (CDs) of patterns in the photomask.

Photomasks are a high-precision plate used to form an integrated circuit (IC) on a wafer. Photomasks may include a transparent substrate and a light-blocking pattern formed on one surface thereof. The light-blocking pattern of the photomask defines a circuit pattern on the wafer through an exposure process. Theoretically, a CD of the light-blocking pattern of the photomask has to precisely correspond to a CD of a circuit pattern formed on the wafer using the light-blocking pattern. Here, the CD of the light-blocking pattern of the photomask may correspond to the CD of the corresponding circuit pattern formed on the wafer with the same magnification or different magnifications. However, the CD of the light-blocking pattern of the photomask may differ from the CD of the circuit pattern formed on the wafer because of defects of an exposure system, such as a spatial distribution failure of a light source or lens defects, and errors in the light-blocking pattern of the photomask. In recent years, with the subminiaturization of patterns, more attention has been paid to improving the dispersion of CDs on a wafer in a hot-spot area that has an insufficient patterning margin.

SUMMARY

A photomask may include a substrate a light-blocking pattern on the substrate. The light-blocking pattern may include an absorber layer and an anti-reflection coating (ARC) layer. The light-blocking pattern may include a first corrected may be a in which a top surface of the absorber layer may be exposed and/or a second corrected may be a in which a correction layer may be on the ARC layer.

In various embodiments, the light-blocking pattern may include the first corrected area, and the ARC layer may be not on the absorber layer in the first corrected area such that the top surface of the absorber layer may be exposed.

According to various embodiments, a thickness of the absorber layer may be smaller in the first corrected area than in a region in which the first corrected area is not provided.

In various embodiments, the light-blocking pattern may include the second corrected area, and the correction layer may be on a top surface of the ARC layer in the second corrected area.

According to various embodiments, the correction layer and the absorber layer may include a same material.

According to various embodiments, the absorber layer may include chromium (Cr), and the correction layer may include chromium, and/or the absorber layer may include an alloy containing molybdenum (Mo) and silicon (Si), and the correction layer may include an alloy containing molybdenum and silicon or silicon.

According to various embodiments, the light-blocking pattern may include the second corrected area, and the correction layer may be on a side surface of the absorber layer in the second corrected area.

In various embodiments, the light-blocking pattern may include the first corrected area, and a critical dimension (CD) of the first corrected area may be greater than a CD obtained before the first corrected area is formed.

According to various embodiments, a thickness of the light-blocking pattern in the first corrected area may be less by a first thickness than a thickness of the light-blocking pattern obtained before the first corrected area is formed. The CD of the first corrected area may be greater by a first width than the CD obtained before the first corrected area is formed, and the first thickness may be about 10 nm or less, and the first width may be about 4 nm or less.

In various embodiments, the light-blocking pattern may include the second corrected area, and a CD of the second corrected area may be less than a CD obtained before the second corrected area is formed.

According to various embodiments, a thickness of the light-blocking pattern in the second corrected area may be greater by a first thickness than a thickness of the light-blocking pattern obtained before the second corrected area is formed. The CD of the second corrected area may be less by a first width than the CD obtained before the second corrected area is formed, and the first thickness may be about 10 nm or less, and the first width may be about 4 nm or less.

According to various embodiments, the photomask may be a transmissive photomask in which the substrate includes a material layer configured to transmit light or a reflective photomask in which the substrate includes a material layer configured to reflect light.

A method of fabricating a photomask may include forming an absorber layer on a substrate, forming a light-blocking pattern by patterning the absorber layer and correcting a critical dimension (CD) of the light-blocking pattern in a correction target area by removing an upper portion of the light-blocking pattern in the correction target area.

In various embodiments, correcting the CD of the light-blocking pattern in the correction target area may include spraying an etch gas onto the light-blocking pattern and irradiating electronic beams (e-beams) onto an upper surface of the light-blocking pattern in the correction target area.

In various embodiments, the method may further include forming an anti-reflection coating (ARC) layer on the absorber layer. Forming the light-blocking pattern may also include patterning the ARC layer.

According to various embodiments, correcting the CD of the light-blocking pattern in the correction target area may include exposing a top surface of the absorber layer by removing a portion of the ARC layer in the correction target area.

In various embodiments, the CD of the light-blocking pattern in the correction target area may increase by removing the upper portion of the light-blocking pattern in the correction target area.

In various embodiments, correcting the CD of the correction target area may include removing the upper portion of the light-blocking pattern in correction target area by using an etching process using electronic beams (e-beams)

or focused ion beams (FIBs), a plasma etching process and/or a sputtering etching process.

A method of fabricating a photomask may include forming an absorber layer on a substrate, forming a light-blocking pattern by patterning the absorber layer and correcting a critical dimension (CD) of the light-blocking pattern in a correction target area by forming a correction layer on a top surface of the light-blocking pattern in the correction target area. The correction layer and the absorber layer may include a same material.

According to various embodiments, correcting the CD of the light-blocking pattern in the correction target area may include spraying a deposition gas onto the light-blocking pattern and irradiating electronic beams (e-beams) onto the top surface of the light-blocking pattern in the correction target area.

According to various embodiments, the method may further include forming an anti-reflection coating (ARC) layer on the absorber layer. Forming the light-blocking pattern may also include patterning the ARC layer, and correcting the CD of the light-blocking pattern in the correction target area may include forming the correction layer on a top surface of the ARC layer in the correction target area.

In various embodiments, forming the correction layer further may include forming the correction layer on a side surface of the absorber layer.

In various embodiments, the CD of the correction target area may be reduced by forming the correction layer on the top surface of the light-blocking pattern in the correction target area.

According to various embodiments, the absorber layer and the correction layer may include chromium (Cr), and/or the absorber layer may include an alloy containing molybdenum (Mo) and silicon (Si) and the correction layer may include an alloy containing molybdenum and silicon or silicon.

A method of fabricating a semiconductor device may include preparing a photomask including a light-blocking pattern formed on a substrate, determining a correction target area of the light-blocking pattern, correcting a critical dimension (CD) of the light-blocking pattern in the correction target area by removing an upper portion of the light-blocking pattern in the correction target area or by forming a correction layer on a top surface of the light-blocking pattern in the correction target area and performing a patterning process on a wafer by using the photomask having a corrected CD.

According to various embodiments, the light-blocking pattern may include an absorber layer and an anti-reflection coating (ARC) layer, and removing the upper portion of the light-blocking pattern in the correction target area may include exposing a top surface of the absorber layer by etching the ARC layer to increase the CD of the light-blocking pattern in the correction target area.

According to various embodiments, the light-blocking pattern may include an absorber layer and an anti-reflection coating (ARC) layer, and forming the correction layer may include forming the correction layer on the ARC layer to reduce the CD of the light-blocking pattern in the correction target area.

In various embodiments, determining the correction target area may include performing a patterning process on a test wafer by using the photomask having the corrected CD and detecting a hot-spot area as a pattern failure region on the test wafer and determining a region of the light-blocking pattern corresponding to the hot-spot area as the correction target area.

In various embodiments, determining the correction target area may include analyzing intensity of light transmitted through the photomask having the corrected CD by using an aerial image mask system (AIMS), determining a hot-spot area having an insufficient patterning margin and determining a region of the light-blocking pattern corresponding to the hot-spot area as the correction target area.

A method of forming a photomask may include forming an absorber layer on a substrate, forming a light-blocking pattern by patterning the absorber layer and forming a corrected area in the light-blocking pattern by removing an upper portion of the light-blocking pattern in the corrected area or by forming a correction layer on the light-blocking pattern in the corrected area. The correction layer and the absorber layer may include a same material.

In various embodiments, a first thickness of the upper portion of the light-blocking pattern removed or a second thickness of the correction layer may be about 10 nm or less.

According to various embodiments, forming the corrected area in the light-blocking pattern may include providing a reaction gas on a surface of the light-blocking pattern and providing an irradiating electronic beam on a portion of the surface of the light-blocking pattern in the corrected area.

According to various embodiments, the method may further include forming an anti-reflection coating (ARC) layer on the absorber layer before patterning the absorber layer. Forming the light-blocking pattern may include sequentially patterning the ARC layer and the absorber layer, and removing the upper portion of the light-blocking pattern in the corrected area may include removing a portion of the ARC layer that is in the corrected area such that an upper surface of the absorber layer is exposed in the corrected area.

According to various embodiments, forming the corrected area in the light-blocking pattern by removing the upper portion of the light-blocking pattern in the corrected area may further include recessing a sidewall of the light-blocking pattern in the corrected area.

In various embodiments, the method may further include forming an anti-reflection coating (ARC) layer on the absorber layer before patterning the absorber layer. Forming the light-blocking pattern may include sequentially patterning the ARC layer and the absorber layer, and forming the correction layer on the light-blocking pattern in the corrected area may include forming the correction layer on the ARC layer such that the ARC layer may be between the absorber layer and the correction layer.

In various embodiments, forming the corrected area in the light-blocking pattern by forming the correction layer on the light-blocking pattern in the corrected area may also include forming the correction layer on a side of the light-blocking pattern in the corrected area.

According to various embodiments, the absorber layer and the correction layer may include chromium (Cr), and/or the absorber layer may include an alloy containing molybdenum (Mo) and silicon (Si), and the correction layer may include an alloy containing molybdenum and silicon or silicon.

BRIEF DESCRIPTION OF THE DRAWINGS

Example embodiments of the inventive concept will be more clearly understood from the following detailed description taken in conjunction with the accompanying drawings in which.

DETAILED DESCRIPTION OF THE EMBODIMENTS

Figure 1:
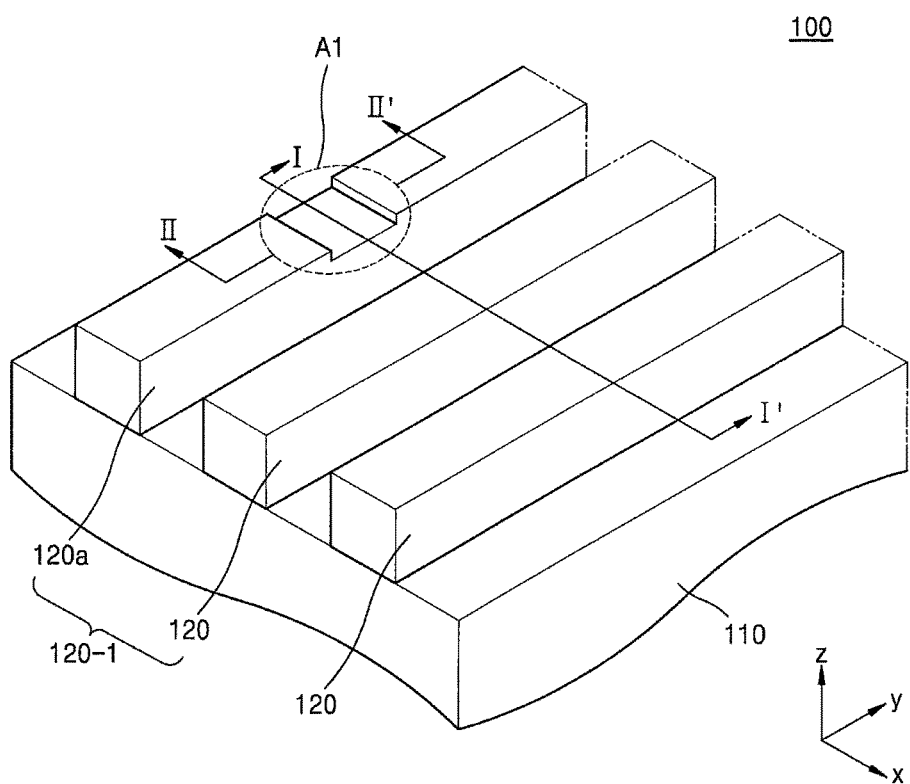
FIG. 1 is a schematic perspective view of a portion of a photomask according to example embodiments of the inventive concept.

The present inventive concept will now be described more fully hereinafter with reference to the accompanying drawings, in which example embodiments of the inventive concept are shown. This inventive concept may, however, be embodied in different forms and should not be construed as limited to the embodiments set forth herein. Rather, these embodiments are provided so that this disclosure is thorough and complete and fully conveys the scope of the inventive concept to one skilled in the art.

It will be understood that when an element or layer is referred to as being "on" or "connected to" another element or layer, it can be directly on or connected to the other element or layer or a third element or layer may be intervened. In the drawings, the thicknesses of layers and regions may be exaggerated for clarity. Descriptions of components and processing techniques that are irrelevant to the embodiments of the present inventive concept are omitted for brevity. Like reference numerals refer to like elements throughout. The terminology used herein to describe embodiments of the inventive concept is not intended to limit the scope of the inventive concept. As used herein the term "and/or" includes any and all combinations of one or more of the associated listed items. It will be understood that the term "pattern" may refer a group of individual pattern elements or respective individual pattern elements.

FIG. 1 is a schematic perspective view of a portion of a photomask 100 according to example embodiments of the inventive concept.

Referring to FIG. 1, the photomask 100 may include a substrate 110 and a light-blocking pattern 120-1.

The substrate 110 may be formed of a light-transmissive material that transmits light. For example, the substrate 110 may be formed of glass or quartz. In the photomask 100, the substrate 110 may be a quartz substrate.

The light-blocking pattern 120-1 may protrude on the substrate 110 and be formed of an opaque material. For example, the light-blocking pattern 120-1 may include an absorber layer (e.g., 122 in FIG. 2A) configured to absorb incident light. For instance, the absorber layer in the light-blocking pattern 120-1 may be formed of an opaque inorganic material including silicon (Si) or at least one of metals including chromium (Cr), chromium oxide (CrO), nickel (Ni), copper (Cu), molybdenum (Mo), aluminum (Al), titanium (Ti), tantalum (Ta), tungsten (W), and ruthenium (Ru), or a compound thereof. Also, the absorber layer may be formed of an alloy of the opaque inorganic material and at least one of the metals. For example, the absorber layer may be formed of molybdenum silicide (Mo/Si), which is an alloy of silicon and molybdenum. The absorber layer may include a single layer or a plurality of layers. When the absorber layer includes a plurality of layers, the light-blocking pattern 120-1 may have a structure in which transparent layers and opaque layers are alternately stacked. Here, each of the transparent layers may be a silicon oxide layer, and each of the opaque layers may include the above-described inorganic material or at least one of the metals.

The light-blocking pattern 120-1 may further include an anti-reflection coating (ARC) layer (e.g., 124 in FIG. 2A) formed on the absorber layer. The ARC layer may function to reduce or possibly prevent reflection of incident light. Reflection characteristics of the photomask may depend on whether or not the ARC layer 124 is present. For example, when the ARC layer 124 is present, a reflection rate may be reduced as compared with a structure in which the ARC layer 124 is not present. When the ARC layer 124 is covered with another material layer, since an anti-reflection function of the ARC layer 124 is reduced, the reflection rate may be increased. Accordingly, by measuring the reflection rate, it may be determined whether the ARC layer 124 is present or whether the ARC layer 124 is covered with another material layer.

The ARC layer 124 may be formed of, for example, silicon nitride (SiN), silicon oxide (SiO), silicon oxynitride (SiON), molybdenum silicon nitride (MoSiN), molybdenum silicon oxide (MoSiO), molybdenum silicon oxynitride (MoSiON), or titanium nitride (TiN). In some embodiments, the ARC layer 124 may include an amorphous carbon layer, an organic ARC layer, or an inorganic ARC layer.

The ARC layer 124 may be formed to a very small thickness. For example, when the light-blocking pattern 120-1 is formed to a thickness of about 50 to about 80 nm, the ARC layer 124 may be formed to a small thickness of about 2 to about 3 nm, the substrate 110 may be formed to a much greater thickness than the light-blocking pattern 120-1. For example, the substrate 110 may be formed to a thickness of about 1.25 µm. It will be understood that thicknesses of the light-blocking pattern 120-1, the ARC layer 124, and the substrate 110 are not limited to the above-described numerical values.

The light-blocking pattern 120-1 may have a predetermined pattern shape, for example, a line-and-space shape in which patterns extend in a second direction (y direction) and are disposed at predetermined intervals in a first direction (x direction) as shown in FIG. 1. It will be understood that the shape of the light-blocking pattern 120-1 is not limited to the line-and-space shape. For example, the light-blocking pattern 120-1 may be formed in various shapes corresponding to various shapes of patterns to be formed on a wafer.

The light-blocking pattern 120-1 may include a general light-blocking pattern 120 and a corrected light-blocking pattern 120a. The general light-blocking pattern 120 may refer to a light-blocking pattern on which an additional correction process is not performed after the light-blocking pattern is formed on the substrate 110, while the corrected light-blocking pattern 120a may refer to a light-blocking pattern of which a predetermined portion is corrected after the light-blocking pattern is formed on the substrate 110. For example, as illustrated with a dashed circle in FIG. 1, a first corrected area A1 may be formed in the corrected light-blocking pattern 120a.

The first corrected area A1 may be formed by removing a portion of a top surface of the general light-blocking pattern 120 by using an etching process. The first corrected area A1 may be formed using various etching methods. For example, the first corrected area A1 may be formed by an etching process using electronic beams (e-beams) or focused ion beams (FIBs), a plasma etching process and/or a sputtering etching process. It will be understood that a method of forming the first corrected area A1 is not limited to the above-described etching processes.

In some embodiments, the first corrected area A1 may be formed by an etching process using e-beams or FIBs. A process of forming the first corrected area A1 by an etching process using e-beams will be described below with reference to FIGS. 11A to 11C. As shown in FIG. 1, a horizontal sectional area of the first corrected area A1 may have a rectangular shape. However, the shape of the first corrected area A1 is not limited to the rectangular shape. For example, the first corrected area A1 may be formed in various shapes to correct CDs as required.

Since the first corrected area A1 is formed by removing the portion of the top surface of the general light-blocking pattern 120 by using an etching process, as shown in FIG. 1, a thickness of the corrected light-blocking pattern 120a in the first corrected area A1 may be less than a thickness of the general light-blocking pattern 120, a thickness of another portion of the corrected light-blocking pattern 120a, or a thickness of the corrected light-blocking pattern 120a before etched. For example, the thickness of the corrected light-blocking pattern 120a in the first corrected area A1 may be less by a first thickness (D1 in FIG. 2A) than the thickness of another portion of the corrected light-blocking pattern 120a, except for the first corrected area A1, or the thickness of the corrected light-blocking pattern 120a before etched. The first thickness may be about 10 nm or less.

By reducing the thickness of the corrected light-blocking pattern 120a in the first corrected area A1 by using an etching process, a CD of a portion of the corrected light-blocking pattern 120a corresponding to the first corrected area A1 may increase to be more than a CD of a peripheral region or a CD of the corrected light-blocking pattern 120a before the first corrected area A1 is formed. An increase in the CD of the portion of the corrected light-blocking pattern 120a corresponding to the first corrected area A1 due to a correction process using an etching process will be described below in further detail with reference to FIGS. 13A to 13C.

Increasing the CD of the portion of the corrected light-blocking pattern 120a corresponding to the first corrected area A1 due to the correction process using the etching process may be controlled to be in the range of several nm or less. For example, increasing the CD of the portion of the corrected light-blocking pattern 120a corresponding to the first corrected area A1 due to the correction process using the etching process may be controlled to be in the range of about 4 nm or less. In this case, assuming that the photomask is a photomask used for a 4:1 reduction projection, increasing a CD of a pattern formed on a wafer may be controlled to be in the range of about 1 nm or less. In other words, when a CD error occurs in the pattern formed on the wafer in the range of about 1 to about 2 nm or less than 1 nm, the CD error on the wafer may be corrected by etching the corresponding portion of the photomask 100 so that the distribution of CDs of patterns formed on the wafer may be improved.

As appreciated by the present inventors, CDs of patterns formed on the photomask 100 may be corrected by directly removing a portion of a light-blocking pattern in which an error occurs, using, for example, e-beams. Specifically, when a protrusion is formed in a region of the light-blocking pattern, a CD of the light-blocking pattern may become less than a required CD due to the protrusion. A CD of the corresponding portion of the light-blocking pattern may be increased by removing the protrusion by using e-beams. However, removal of the protrusion using e-beams may not be used when a size of a region including the protrusion is small. When e-beams are irradiated, not only a region directly irradiated with e-beams but also a peripheral region thereof may be affected by energy of the e-beams, and a portion of the peripheral region also may be removed. For example, methods removing portions of a light-blocking pattern using e-beam irradiation may not be used when a region that includes the portions to be removed is about 20 nm or less.

In the first corrected area A1, the portion of the top surface of the general light-blocking pattern 120 is removed to form the corrected light-blocking pattern 120a so that a photomask in which CDs of patterns in the first corrected area A1 may be corrected in a range of several nm or less. Also, when the photomask 100 of which a CD is corrected in a range of several nm or less is used to form patterns on a wafer, CDs of patterns on the wafer may be corrected in a range of several nm or less, for example, about 1 nm, and the dispersion of CDs of the patterns formed on the wafer can be improved.

Figure 2A:
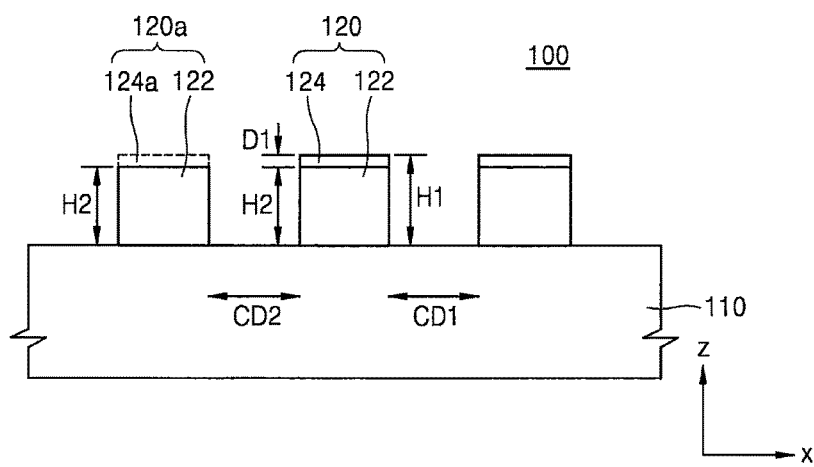
FIGS. 2A and 2B are cross-sectional views taken along the lines I-I' and II-II' of the photomask of FIG. 1.
Figure 2B:
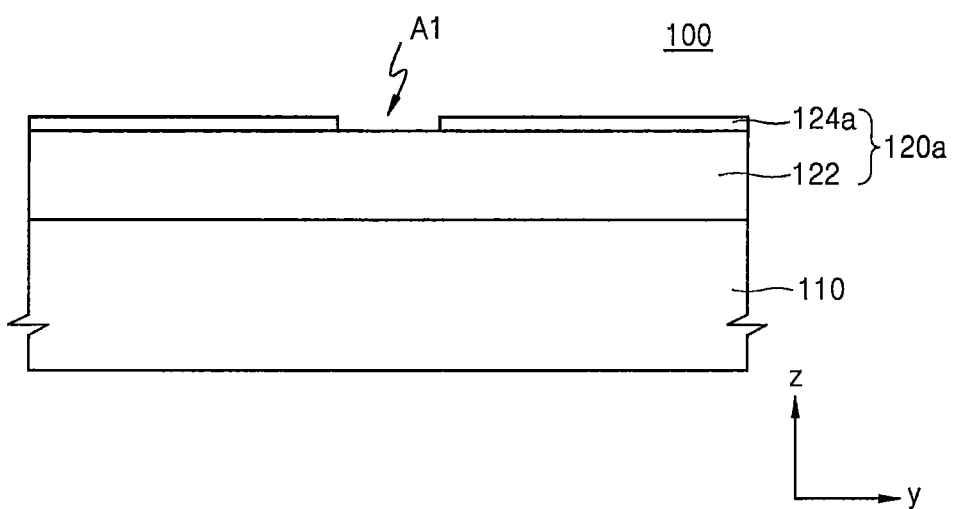

FIGS. 2A and 2B are cross-sectional views taken along the lines I-I' and II-II' of the photomask 100 of FIG. 1.

Referring to FIGS. 2A and 2B, the general light-blocking pattern 120 may include an absorber layer 122 and an ARC layer 124. As described above, the absorber layer 122 may be formed of an inorganic material or a metal and may be capable of absorbing incident light. In some embodiments, a reflective layer having reflection characteristics may be used instead of the absorber layer 122 to block light. The corrected light-blocking pattern 120a also may include the absorber layer 122 and an ARC layer 124a. However, an ARC layer may not be present in the first corrected area A1 of the corrected light-blocking pattern 120a. For example, a portion of the ARC layer 124a may be removed using an etching process from the first corrected area A1 and the ARC layer 124a may remain on the absorber layer 122 outside of the first corrected area A1. The ARC layer 124a is illustrated with a dashed line in FIG. 2A since the ARC layer 124a is removed from the first corrected area A1.

For example, the general light-blocking pattern 120 may have a thickness corresponding to a first height H1, the absorber layer 122 may have a thickness corresponding to a second height H2, and the ARC layer 124 may have a first thickness D1. Since only the absorber layer 122 may be disposed in the first corrected area A1, the corrected light-blocking pattern 120a may have a thickness corresponding to the second height H2. Assuming that intervals between the light-blocking patterns 120-1 are equal, a first CD CD1 between two adjacent general light-blocking patterns 120 may be less than a second CD CD2 between the corrected light-blocking pattern 120a and the general light-blocking pattern 120. Here, the second CD CD2 may refer to a CD between the first corrected area A1 of the corrected light-blocking pattern 120a and a portion of the general light-blocking pattern 120 adjacent to the first corrected area A1.

To put it in other words, a CD obtained before the first corrected area A1 is formed may correspond to the first CD CD1, and the first CD CD1 may be less than the second CD CD2 that is obtained after the first corrected area A1 is formed. Therefore, it can be seen that the CD may be increased from the first CD CD1 to the second CD CD2 due to the formation of the first corrected area A1. This effect may be utilized again as follows. For example, all intervals between the light-blocking patterns 120-1 may be the same. In this case, when a CD of a first portion of the light-blocking pattern 120-1 is less than a CD of a second portion thereof, the first corrected area A1 may be formed in the first portion so that the CD of the first portion can be corrected to be equal to the CD of the second portion. As another example, a very small CD may be formed in a portion of the light-blocking pattern that may correspond to a hot-spot area and may have an insufficient patterning margin. Due to defects of an exposure system or errors in the fabrication of a photomask, a CD may become smaller than required or approximately 0. In these cases, the first corrected area A1 may be formed in the portion of the light-blocking pattern so that the CD may be increased to a required level.

A CD of patterns of a photomask may be directly measured using a scanning electron microscopy (SEM) or an atomic force microscope (AFM) or may be measured using an indirect method. For example, the CD of patterns of a photomask may be determined by measuring an interval between the patterns formed on the wafer by using an exposure process. When the exposure process is performed using a 1:1 actual projection, an interval between the patterns on the wafer may correspond to a CD of the corresponding pattern of the photomask. Also, when the exposure process is performed using a 4:1 reduction projection, a numerical value equivalent to four times the interval between the patterns formed on the wafer may correspond to the CD of the corresponding pattern of the photomask.

In addition to a method of measuring a CD of patterns by forming an actual pattern on a wafer by using an exposure process, as an indirect method, the CD of the patterns may be measured using an aerial image mask system (AIMS). The AIMS, which is a system configured to emulate a photomask, may capture light transmitted through the photomask, with a charge-coupled device (CCD) camera, convert a profile of light intensities into a pattern image, and analyze the pattern image. The intensity of light transmitted through the photomask may be analyzed using the AIMS so that the CD of patterns of a photomask can be measured.

Hereinafter, the CD of patterns formed on a photomask may refer to not a directly measured value but an indirectly measured value, such as a CD of an actual pattern formed on a wafer or a CD measured using an AIMS.

When the CD is measured using an AIMS, a portion in which the light-blocking pattern 120-1 is formed may have a low light intensity, while a portion of a substrate between the light-blocking patterns 120-1 may have a high light intensity. Thus, the portion in which the light-blocking pattern 120-1 is formed may be referred to as a dark pattern, while the portion of the substrate between the light-blocking patterns 120-1 may be referred to as a clear pattern. Also, a width of the clear pattern corresponding to an interval between the light-blocking patterns 120-1 may be typically measured as a CD, and the CD of the clear pattern may be referred to as a clear CD. Hereinafter, unless otherwise mentioned, a CD may refer to a clear CD.

The reason the CD is increased due to the formation of the first corrected area A1 may be analyzed as follows: First, the intensity of light passing through the absorber layer 122 (i.e., the dark pattern) in the first corrected area A1 may minutely increase, and the increased intensity of light may contribute to increasing the intensity of light in the clear pattern between the dark patterns. As a result, an increase in the intensity of light in the clear pattern may correspond to a CD increase. Second, incident light having an inclination may be less blocked by the dark pattern of which a thickness is reduced, in the first corrected area A1. Thus, the amount of light incident to the clear pattern may increase, and the increased amount of light may contribute to increasing the intensity of light in the clear pattern.

In addition, though a structure in which the ARC layer 124 is disposed on the absorber layer 122 has been described above with reference to FIGS. 1 to 2B, the ARC layer 124 may be omitted as described above. When the ARC layer 124 is omitted, the first corrected area A1 may be formed by removing a portion of a top surface of the absorber layer 122. The ARC layer 124 may be omitted in embodiments described below.

Figure 3A:
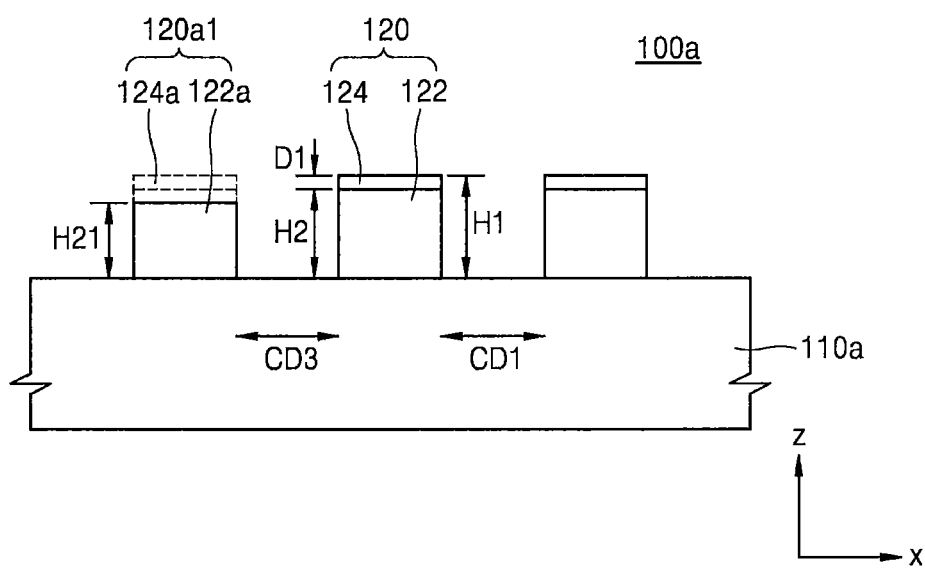
FIGS. 3A and 3B are cross-sectional views of modified examples of FIGS. 2A and 2B, respectively, which are taken along the lines I-I' and II-II' of the photomask of FIG. 1.
Figure 3B:
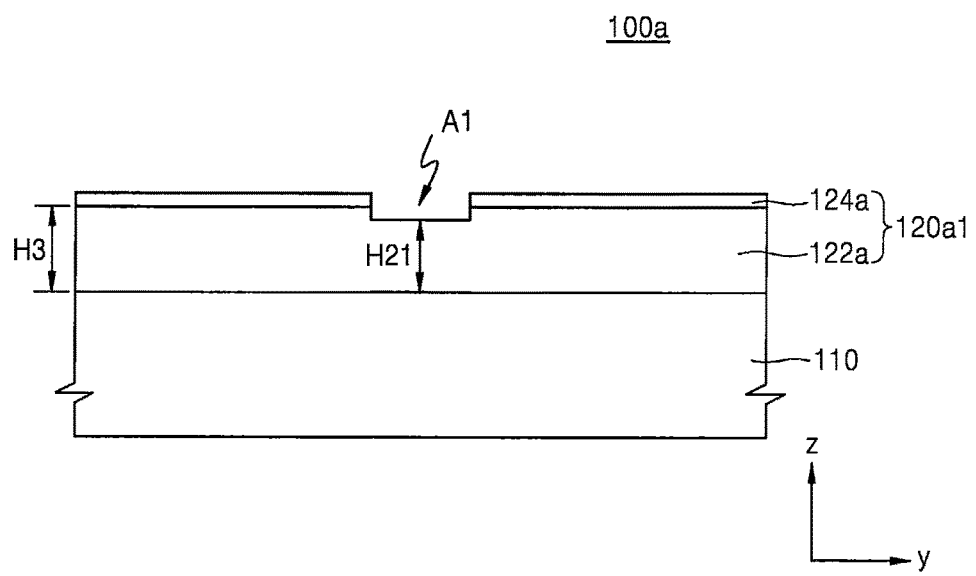

FIGS. 3A and 3B are cross-sectional views of modified examples of FIGS. 2A and 2B, respectively, which are taken along the lines I-I' and II-II' of the photomask 100 of FIG. 1. For brevity, the modified examples will be described with further reference to FIGS. 1 to 2B, and the same descriptions as provided above are simplified or omitted.

Referring to FIGS. 3A and 3B, a photomask 100a according to some embodiments may be similar to the photomask 100 of FIG. 1 but have a different etch depth in a first corrected area A1. For example, the first corrected area A1 may be formed by etching not only an ARC layer 124a but also a portion of an upper portion of an absorber layer 122a. Thus, a thickness of the absorber layer 122a in the first corrected area A1 may correspond to a third height H21. The third height H21 may be less than a second height H2, which may correspond to the thickness of an absorber layer 122 of a general light-blocking pattern 120.

As shown in FIG. 3A, a portion corresponding to the portion of the upper portion of the absorber layer 122a that is removed from the first corrected area A1 may not be seen in a cross-section like the ARC layer 124a and thus illustrated with a dashed line under the ARC layer 124a.

The first corrected area A1 is formed by etching the portion of the upper portion of the absorber layer 122a so that the corresponding portion may have a third CD CD3. The third CD CD3 may be greater than the first CD CD1 and greater than the second CD CD2 in FIG. 2A. By forming the absorber layer 122a in the first corrected area A1 to a smaller thickness than the absorber layer 122 of FIG. 2A, the intensity of light in the corresponding clear pattern may further increase so that the third CD CD3 can be greater than the second CD CD2.

FIGS. 4A to 4D are cross-sectional views of modified examples of FIG. 2A, which are taken along the line I-I' of the photomask 100 of FIG. 1. For brevity, the modified examples will be described with further reference to FIGS. 1 to 2B, and the same descriptions as provided above are simplified or omitted.

Figure 4A:
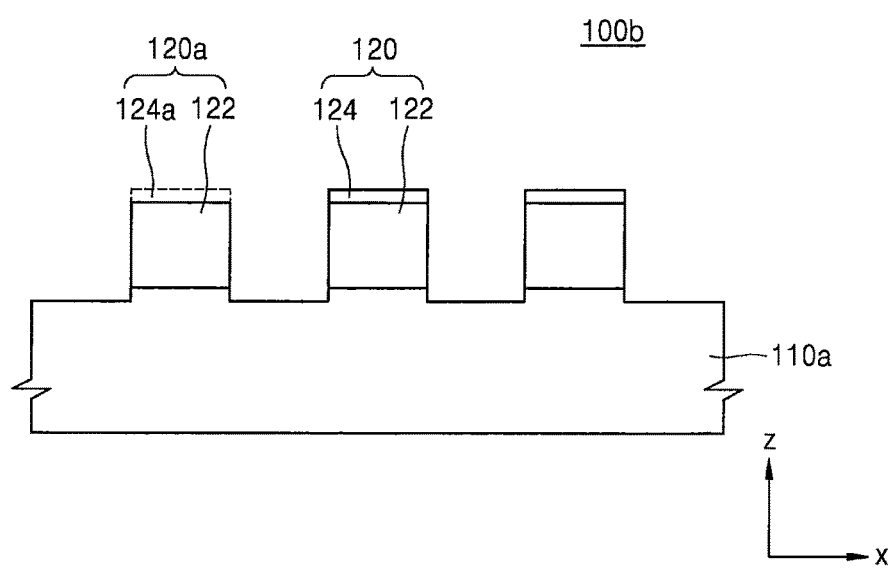
FIGS. 4A to 4D are cross-sectional views of modified examples of FIG. 2A, which are taken along the line I-I' of the photomask of FIG. 1.

Referring to FIG. 4A, a photomask 100b according to some embodiments may be formed as a substrate etching type by etching a portion of an upper portion of a substrate 110a corresponding to a clear pattern between light-blocking patterns 120. When an absorber layer 122 is patterned, the substrate-etching-type photomask 100b may be formed by etching the portion of the upper portion of the substrate 110a by using an over-etching process.

In the case of the substrate-etching-type photomask 100b, the same effects as a phase-shift mask (PSM) may be obtained by appropriately controlling an etched thickness of the substrate 110a and appropriately controlling a transmittance of the absorber layer 122.

In the photomask 100b, a first corrected area A1 may be formed to correct a CD of the corresponding portion. For example, a portion of a top surface of a corrected light-blocking pattern 120a corresponding to a portion of which a CD needs to be minutely increased may be removed by etching to form the first corrected area A1, thereby embodying a photomask in which the CD of the corresponding portion is minutely increased.

Figure 4B:
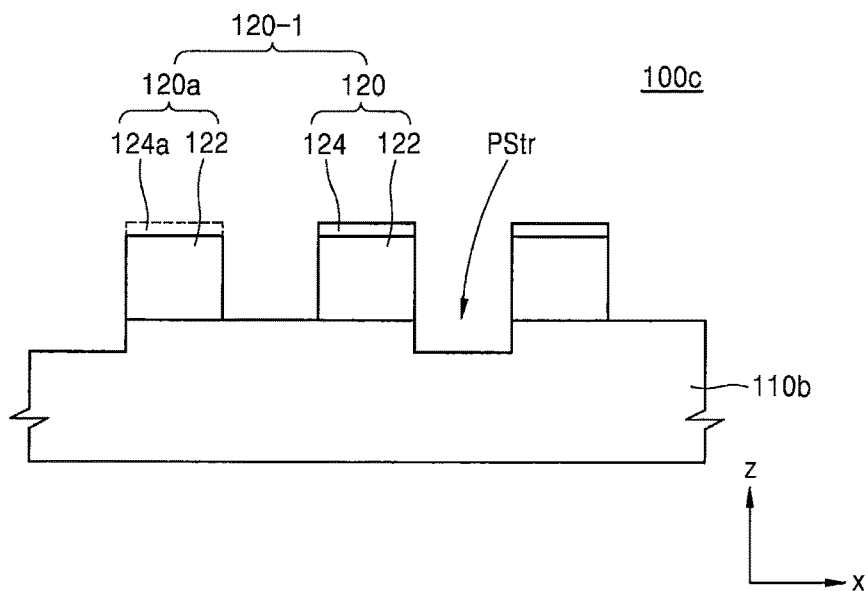

Referring to FIG. 4B, a photomask 100c according to some embodiments may have a PSM structure. Unlike the photomask 100 of FIG. 1, in the PSM-type photomask 100c, a phase-shift trench PStr may be formed by alternately etching portions of a top surface of a substrate 110b corresponding to clear patterns. Similar to the photomask 100 of FIG. 1, light-blocking patterns 120-1 may be formed on the substrate 110b. The PSM-type photomask 100c may be a photomask of which a resolution is to be increased by inverting or shifting the phase of light transmitted through a clear pattern adjacent to the clear pattern in which the phase-shift trench PStr is formed.

Photomasks may be classified into binary masks and PSMs. Although fabricating a binary mask is easy, when fine patterns are formed in the binary mask, images are not properly defined on a wafer. More specifically, the binary mask may have a structure in which a light-blocking pattern 120-1 is formed on a substrate 110, like the photomask 100 of FIG. 1, and light cannot pass through a dark pattern corresponding to an absorber layer but can pass through a clear pattern free from the absorber layer. However, when very fine light-blocking patterns are formed, light passing through clear patterns disposed on both sides of the dark pattern may diffract and constructively interfere so that the dark pattern cannot properly function to block light. Therefore, when the dark pattern does not have a sufficient width, the dark pattern cannot appropriately function to block light, thus resulting in a resolution limit.

In a PSM, a phase shift layer is formed on a conventional substrate to invert or shift the phase of light transmitted through the phase shift layer so that interference between adjacent light beams can be minimized to improve resolution. Although the PSM may overcome drawbacks of a binary mask, the PSM may involve complicated fabrication processes and have a higher failure rate than the binary mask.

PSM-type photomasks may be categorized as either an alternating aperture PSM (AAPSM) having the same structure as the photomask 100c or an embedded attenuated PSM (EAPSM) in which a phase shift layer is formed on a substrate instead of an absorber layer.

The EAPSM may use a MoSi layer or MoSiON layer as a phase shift layer and generally has a transmission of about 6% or 8%. When light transmitted through the phase shift layer and light directly transmitted through a quartz substrate reaches a wafer to make a phase difference of about 180°, destructive interference may occur at an interface between patterns, thereby solving problems of a binary mask. Since light transmitted through the phase shift layer has a low transmission rate, photoresist may not react with the light. In other words, when a portion of a mask pattern is changed from opacity into halftone, a phase may be inverted. Thus, the performance of formation of a photoresist pattern on the wafer may be improved, and a resolution and depth of focus (DOF) may be improved during a photolithography process.

In the AAPSM, a quartz substrate may be selectively etched so that light transmitted through an etched portion has a phase difference of 180° with respect to light transmitted through an unetched portion. Since the phase difference of 180° is made by etching the quartz substrate, there may be no difference in transmission rate between the etched portion and the unetched portion. Accordingly, complete destructive interference may occur at an interface between adjacent patterns. In the photomask 100c, an absorber layer 122 may be formed on the quartz substrate 110b to form patterns. However, in some embodiments, for example, a chrome-less PSM, a mask may be fabricated by forming a destructive interference region by only using patterns formed on a quartz substrate without an absorber layer.

Accordingly, the AAPSM may include phase inversion regions that are configured to invert a phase of light by about 180° and may be formed on both sides of a pattern to form a portion in which light transmitted through the mask diffracts and destructively interferes and has a lowest intensity of almost about 0 on the wafer. Therefore, even when the width of the absorber layer 122 is small, the interface at which the phase of light is inverted may always function to block light and may lead to an improvement in resolution.

In the PSM-type photomask 100c, a CD of the corresponding portion may be corrected by forming a first corrected area A1. For example, a portion of a top surface of a corrected light-blocking pattern 120a corresponding a portion of which a CD needs to be minutely increased may be removed using an etching process, thereby forming the first corrected area A1. Thus, a PSM-type photomask, in which the CD of the corresponding portion is minutely increased, may be formed. In addition, an EAPSM-type photomask may be formed using the same principle as described above so that a CD of the corresponding portion may be increased by removing a portion of a top surface of a phase shift layer by etching.

Figure 4C:
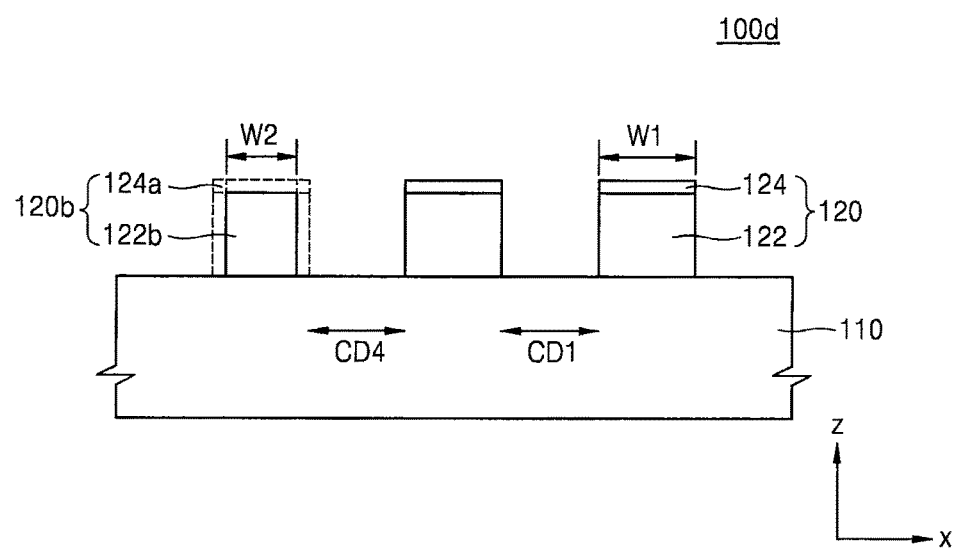

Referring to FIG. 4C, in a photomask 100d, a corrected light-blocking pattern 120b of which a top surface portion and both side surface portions are removed may be formed in a first corrected area A1. A second width W2 corresponding to a width of the corrected light-blocking pattern 120b in the first corrected area A1 may be less than a first width W1 of a general light-blocking pattern 120. Since the side surface portions of the corrected light-blocking pattern 120b are also removed in the first corrected area A1, a fourth CD CD4 of the corresponding portion in the first corrected area A1 may be greater than the first CD CD1 and greater than the second CD CD2 of the first corrected area A1 of a structure in which only the top surface portion is removed.

When the side surface portions of the corrected light-blocking pattern 120b are also removed in the first corrected area A1, a clear CD may increase in proportion to a thickness of one of the removed side surface portions. Also, a CD may increase due to an increase in intensity caused by an increase in transmission rate of an absorber layer and an increase in intensity caused by an increase in the amount of obliquely incident light. Accordingly, the fourth CD CD4 of the first corrected area A1 may be greater than the second CD CD2 of the first corrected area A1 of which only the top surface is removed.

Figure 4D:
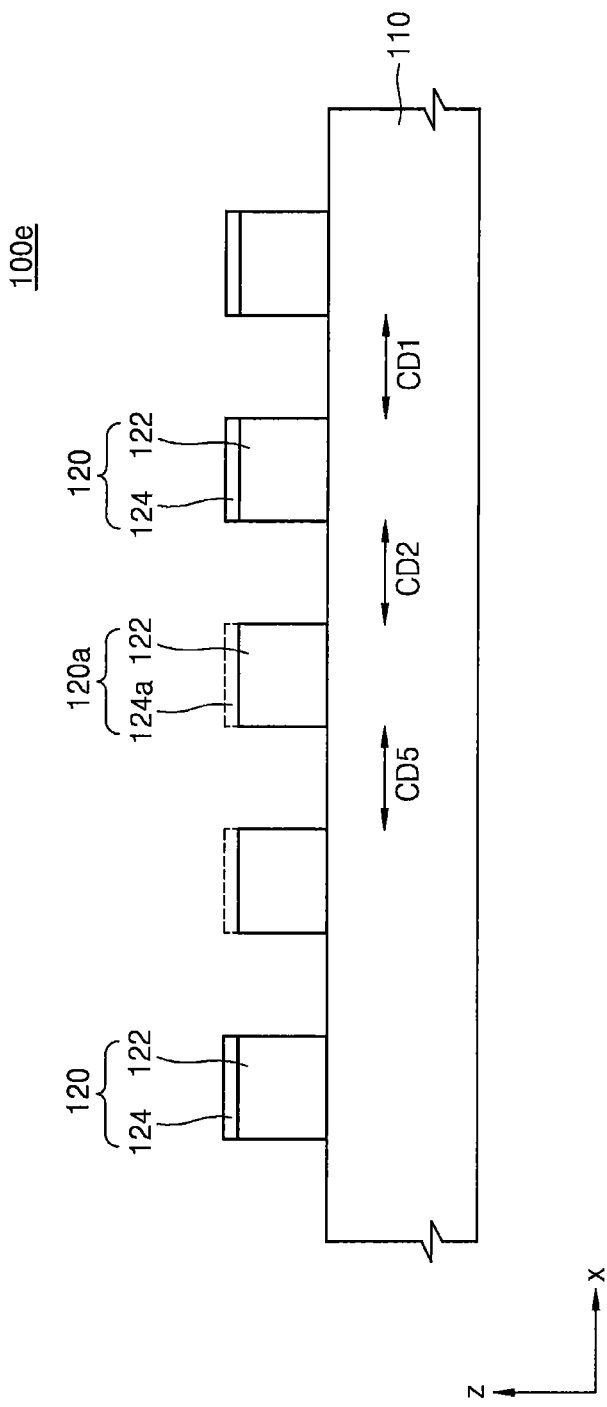

Referring to FIG. 4D, in a photomask 100e, first corrected areas A1 may be formed in both adjacent corrected light-blocking patterns 120a. By forming the two first corrected areas A1 in both adjacent corrected light-blocking patterns 120a, a CD between the two first corrected areas A1 may be a fifth CD CD5, which may be greater than the second CD CD2, which is a CD between the corrected light-blocking pattern 120a and the general light-blocking pattern 120 in the first corrected area A1. This effect may be obtained because a CD increase caused by an increase in transmission rates of the both first corrected areas A1 and a CD increase caused by an increase in the amount of obliquely incident light further increase.

Although examples in which one or two first corrected areas A1 are formed have been described, the photomasks according to some embodiments are not limited to forming one or two first corrected areas A1. For example, three or more first corrected areas A1 may be formed in a photomask according to a number of portions of which CDs need to be corrected. Also, when multiple first corrected areas A1 are formed, the first corrected areas A1 may be disposed in adjacent corrected light-blocking patterns 120a as shown in FIG. 4D or disposed in corrected light-blocking patterns 120a not adjacent one another.

Figure 5A:
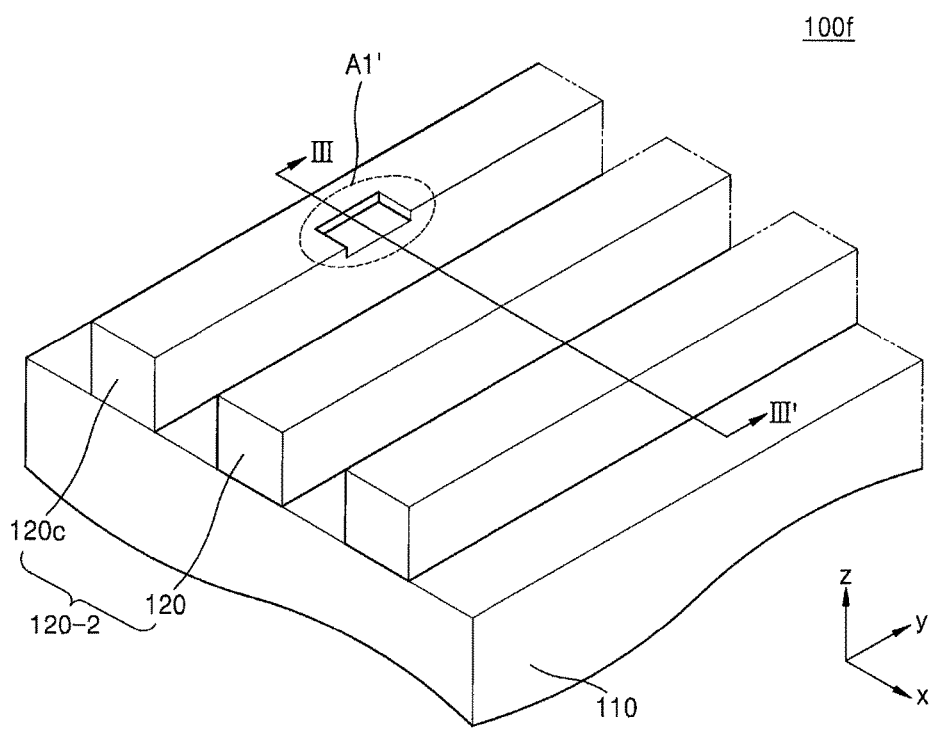
FIG. 5A is a schematic perspective view of a portion of a photomask according to example embodiments of the inventive concept.
Figure 5B:
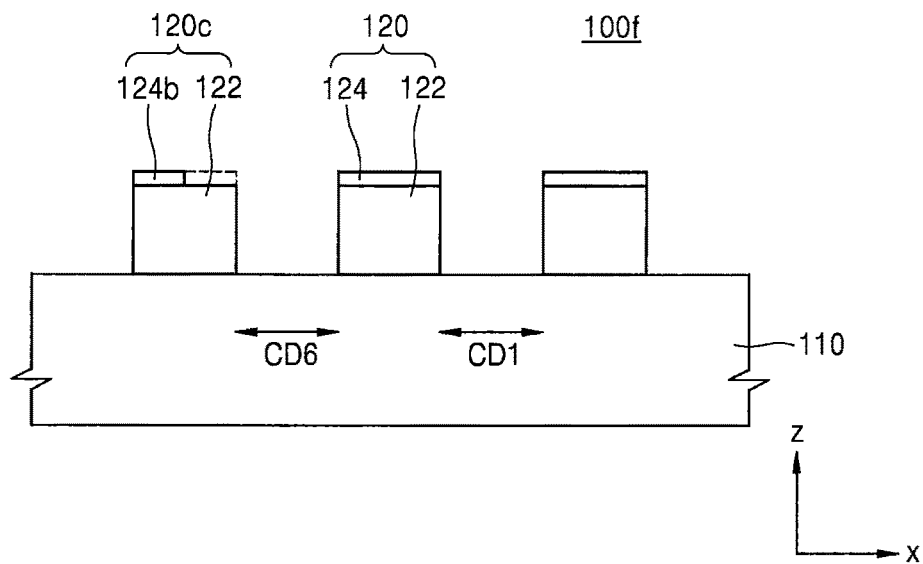
FIG. 5B is a cross-sectional view taken along the line of the photomask of FIG. 5A.

FIG. 5A is a schematic perspective view of a portion of a photomask 100f according to example embodiments of the inventive concept, and FIG. 5B is a cross-sectional view taken along the line of the photomask 100f of FIG. 5A.

Referring to FIGS. 5A and 5B, similar to the photomask 100 of FIG. 1, the photomask 100f may include a substrate 110 and a light-blocking pattern 120-2. The light-blocking pattern 120-2 may include a general light-blocking pattern 120 and a corrected light-blocking pattern 120c in which a first corrected area A1' is formed. The general light-blocking pattern 120 may be the same as the general light-blocking pattern 120 of the photomask 100 of FIG. 1. The corrected light-blocking pattern 120c may be different from the corrected light-blocking pattern 120a of the photomask 100 of FIG. 1.

For example, a first corrected area A1' formed in the corrected light-blocking pattern 120c of the photomask 100f may have a different shape from the first corrected area A1 formed in the corrected light-blocking pattern 120a of the photomask 100 of FIG. 1. Specifically, the first corrected area A1' may be formed by removing a portion of a top surface of the corrected light-blocking pattern 120c. In this case, the first corrected area A1' may be formed by removing not the entire portion in a widthwise direction (i.e., transverse direction) of the corrected light-blocking pattern 120c but to a portion in the widthwise direction of the corrected light-blocking pattern 120c. It will be understood that the widthwise direction refers to x direction of FIG. 5A. As shown in FIG. 5B, the first corrected area A1' may be formed only in a right upper portion of the corrected light-blocking pattern 120c. Thus, in the first corrected area A1', an ARC layer 124b may not be disposed on the right upper portion of the corrected light-blocking pattern 120c but may be disposed on a left upper portion thereof.

When the first corrected area A1' is partially formed in a widthwise direction of the corrected light-blocking pattern 120c, that is, in the first direction (x direction), a CD of a portion corresponding to the first corrected area A1' may be a sixth CD CD6, which may be greater than the first CD CD1 and less than the second CD CD2. Accordingly, by partially forming the first corrected area A1' in the widthwise direction of the corrected light-blocking pattern 120c, the CD of the corresponding portion may be corrected more minutely.

In the photomask 100f, a horizontal cross-section of the first corrected area A1' has a rectangular shape, but the shape of the first corrected area A1' is not limited to a rectangular shape. For example, the first corrected area A1' may have various shapes, for example, a semi-circular shape or a semi-elliptical shape.

Figure 6A:
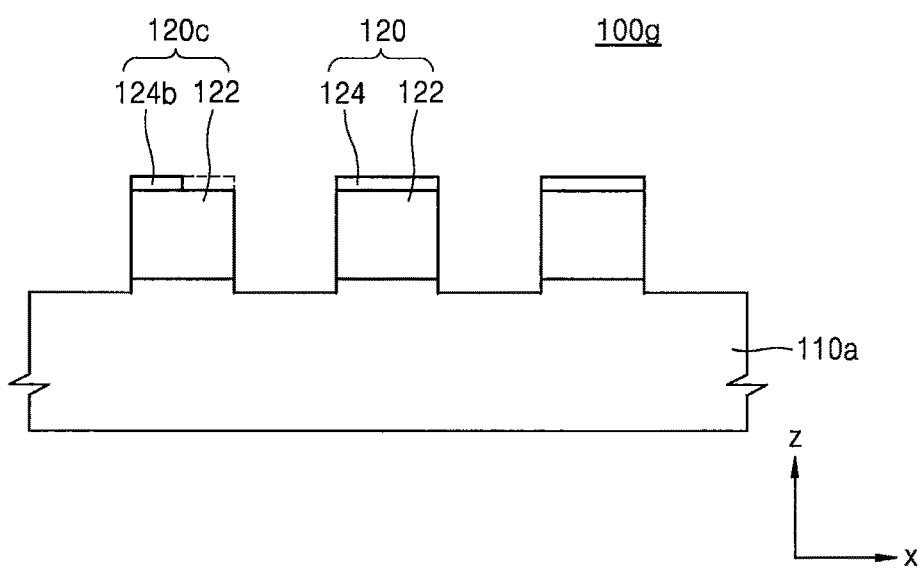
FIGS. 6A to 6C are cross-sectional views of modified examples of FIG. 5B, which are taken along the line of the photomask of FIG. 5A.
Figure 6B:
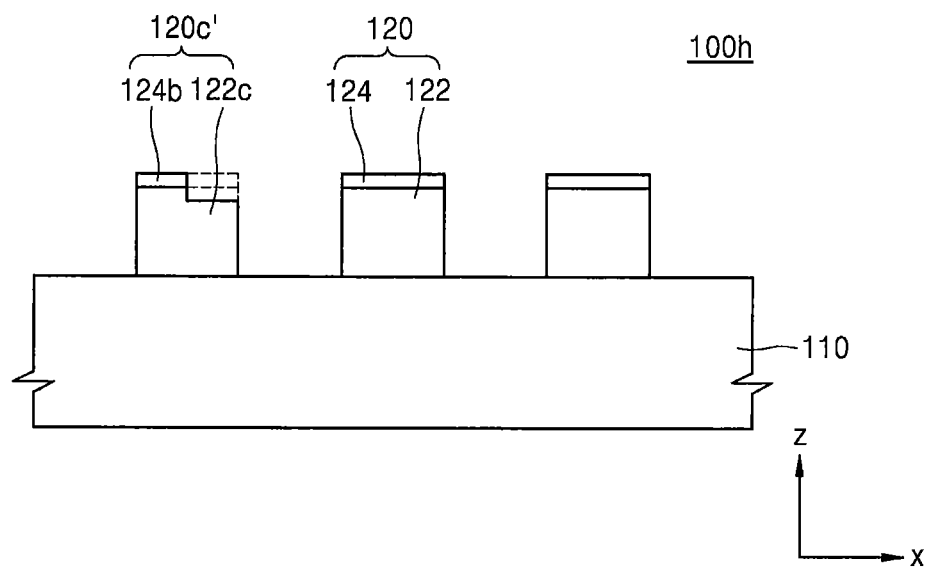
Figure 6C:
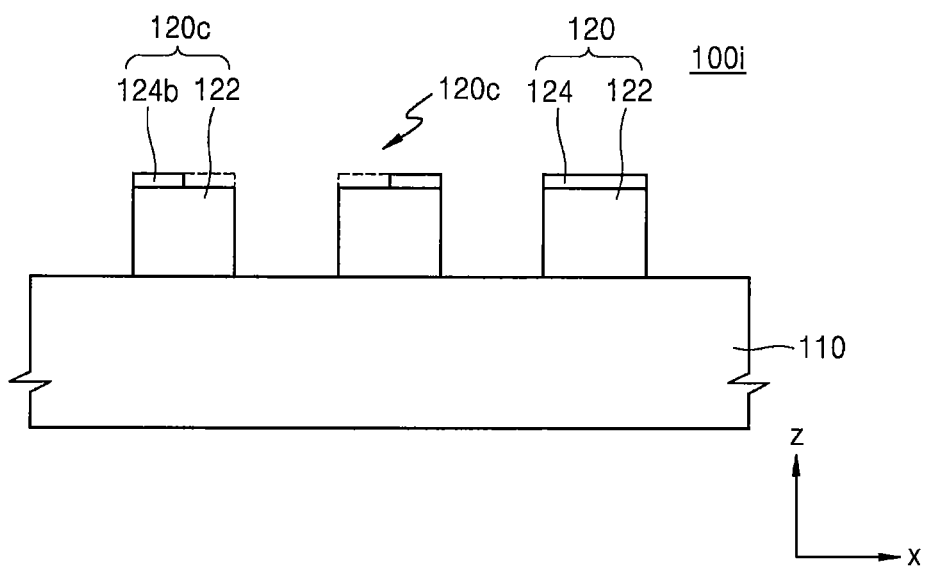

FIGS. 6A to 6C are cross-sectional views of modified examples of FIG. 5B, which are taken along the line of the photomask 100f of FIG. 5A. For brevity, the modified examples will be described with further reference to FIGS. 5A and 5B, and the same descriptions as provided above with reference to FIGS. 1 to 5B are simplified or omitted.

Referring to FIG. 6A, similar to the photomask 100f of FIGS. 5A and 5B, a photomask 100g according to the present embodiment may include a first corrected area A1' formed in only a portion in a widthwise direction of a corrected light-blocking pattern 120c. Also, similar to the photomask 100b of FIG. 4A, the photomask 100g may have a substrate-etching-type structure in which a portion of an upper portion of a substrate 110a is etched. As a result, the photomask 100g may have a structure in which the shape of the first corrected area A1' of the photomask 100f of FIGS. 5A and 5B is combined with the substrate-etching-type structure of the photomask 100b of FIG. 4A.

As described above, the photomask 100g may obtain the same effects as a PSM by appropriately controlling an etched thickness of the substrate 110a and appropriately controlling a transmission rate of the absorber layer 122.

Referring to FIG. 6B, similar to the photomask 100f of FIGS. 5A and 5B, a photomask 100h may include a first corrected area A1' formed in only a portion of a corrected light-blocking pattern 120c' in a widthwise direction (i.e., transverse direction) thereof. Also, similar to the photomask 100a of FIG. 3A, the photomask 100h according to the present embodiment may have a structure in which a portion of a top surface of an absorber layer 122c is also removed using an etching process. For example, in the photomask 100h, the first corrected area A1' may be formed in only the portion of the corrected light-blocking pattern 120c' in the widthwise direction thereof by removing not only part of an ARC layer 124b but also a portion of the upper portion of the absorber layer 122c.

Referring to FIG. 6C, similar to the photomask 100f of FIG. 5A, in a photomask 100i, a first corrected area A1' may be formed only in a portion of the corrected light-blocking pattern 120c in a widthwise direction (i.e., transverse direction) thereof. Also, similar to the photomask 100e of FIG. 4D, in the photomask 100i, first corrected areas A1' may be respectively formed in two adjacent corrected light-blocking patterns 120c. As shown in FIG. 6C, the two first corrected areas A1' respectively formed in the two adjacent corrected light-blocking patterns 120c may be formed in opposite directions to each other. For example, one first corrected area A1' may be formed in a right upper portion of a left corrected light-blocking pattern 120c, and the other first corrected area A1' may be formed in a left upper portion of a right corrected light-blocking pattern 120c.

However, in the photomask 100i, the two first corrected areas A1' respectively formed in the two adjacent corrected light-blocking patterns 120c may be formed in the same direction. For example, the two first corrected areas A1' may be formed in right upper portions of the left and right corrected light-blocking patterns 120c or left upper portions thereof.

Figure 7A:
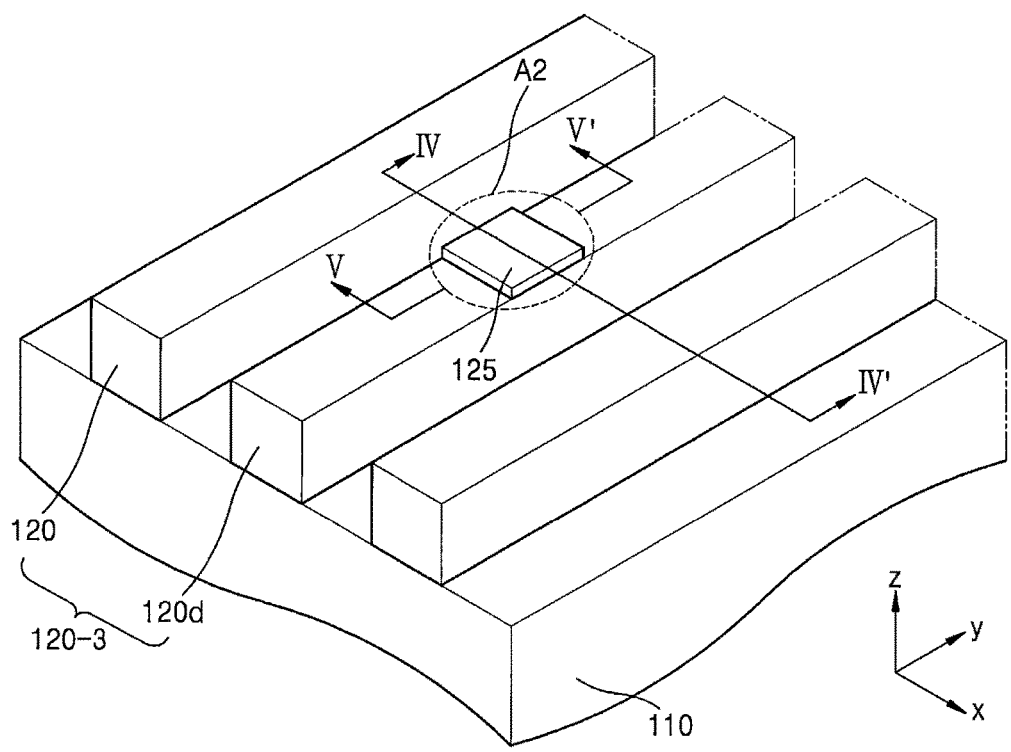
FIG. 7A is a schematic perspective view of a portion of a photomask according to example embodiments of the inventive concept.
Figure 7B:
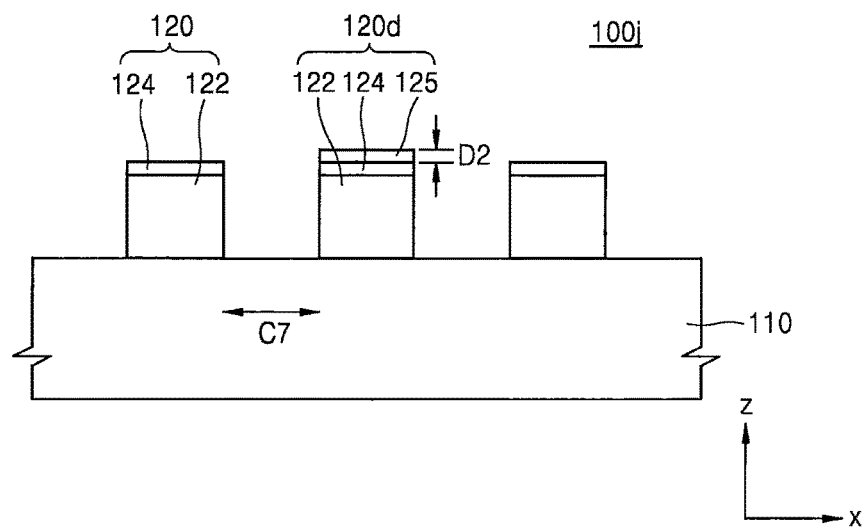
FIGS. 7B and 7C are cross-sectional views taken along the lines IV-IV' and V-V' of the photomask of FIG. 7A.
Figure 7C:
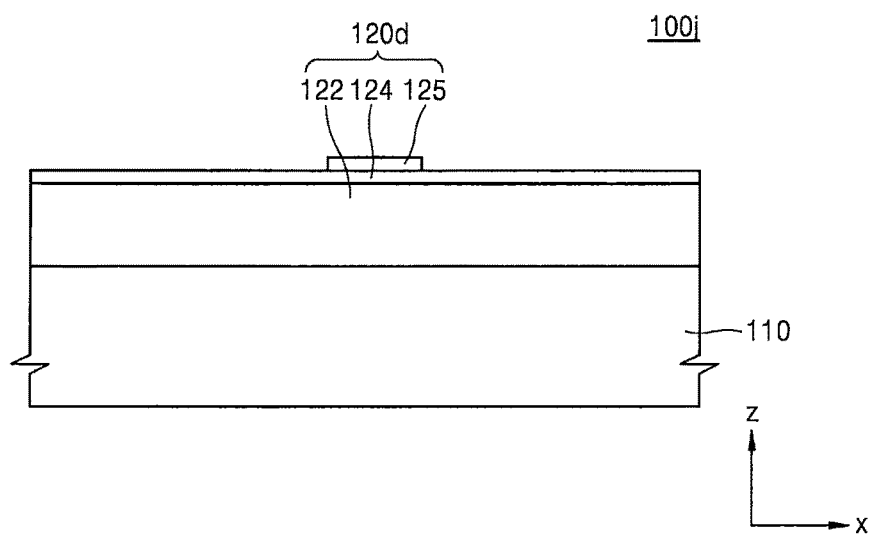

FIG. 7A is a schematic perspective view of a portion of a photomask 100j according to an example embodiment of the inventive concept. FIGS. 7B and 7C are cross-sectional views taken along the lines IV-IV' and V-V' of the photomask 100j of FIG. 7A. The same descriptions as in FIGS. 1 to 2B are simplified or omitted for brevity.

Referring to FIGS. 7A to 7C, the photomask 100j may include a substrate 110 and a light-blocking pattern 120-3. The light-blocking pattern 120-3 may include a general light-blocking pattern 120 and a corrected light-blocking pattern 120d in which a second corrected area A2 is formed. The substrate 110 and the general light-blocking pattern 120 may be the same as described above with reference to the photomask 100 of FIG. 1.

The second corrected area A2 may be formed in the corrected light-blocking pattern 120d. In this case, the second corrected area A2 may have a structure in which an additional correction layer 125 is formed on an ARC layer 124. The correction layer 125 of the second corrected area A2 may be formed using various deposition processes. For example, the second corrected area A2 may be formed using a deposition process using e-beams or FIBs, a plasma deposition process, and/or a sputtering deposition process. It will be understood that a method of forming the correction layer 125 of the second corrected area A2 is not limited to the above-described deposition processes.

In the photomask 100j, the correction layer 125 of the second corrected area A2 may be formed using a deposition process using e-beams or FIBs. A process of forming the second corrected area A2 on the corrected light-blocking pattern 120d by forming the correction layer 125 using the deposition process using e-beams will be described below in further detail with reference to FIGS. 12A to 12C. As shown in FIG. 7A, a horizontal sectional area of the correction layer 125 of the second corrected area A2 may have a rectangular shape. However, the shape of the correction layer 125 of the second corrected area A2 is not limited to a rectangular shape. For example, the correction layer 125 of the second corrected area A2 may be formed in various shapes to correct CDs as required.

The correction layer 125 of the second corrected area A2 may be formed of a material that absorbs light. Also, the correction layer 125 may be formed of the same material as the underlying absorber layer 122 or a material similar to the absorber layer 122. For example, the correction layer 125 may be formed of an opaque inorganic material containing silicon or at least one of metals including Cr, CrO, Ni, Cu, Mo, Al, Ti, Ta, W, and Ru, or a compound thereof. Also, the correction layer 125 may be formed of an alloy of the inorganic material and at least one of the metals. For instance, the correction layer 125 may be formed of molybdenum silicide (Mo/Si), which is an alloy of Si and Mo. Specifically, when the absorber layer 122 is formed of Cr, the correction layer 125 may also be formed of Cr. Also, when the absorber layer 122 is formed of Mo/Si, the correction layer 125 may be formed of Mo/Si or formed of a silicon-containing inorganic material or silicon.

Since the second corrected area A2 is embodied by forming the correction layer 125 on the ARC layer 124, a thickness of the corrected light-blocking pattern 120d in the second corrected area A2 may be greater than a thickness of the general light-blocking pattern 120, a thickness of another portion of the corrected light-blocking pattern 120d or a thickness of the corrected light-blocking pattern 120d obtained before the correction layer 125 is formed. For example, the thickness of the corrected light-blocking pattern 120d in the second corrected area A2 may be greater by a second thickness D2 than the thickness of the another portion of the corrected light-blocking pattern 120d, except for the second corrected area A2, or the thickness of the corrected light-blocking pattern 120d in the second corrected area A2 obtained before the correction layer 125 is formed. The second thickness D2 may be about 10 nm or less.

By increasing the thickness of the corrected light-blocking pattern 120d in the second corrected area A2 due to the correction layer 125, a CD of a portion corresponding to the second corrected area A2 may decrease to be less than a CD of a peripheral region or a CD obtained before the second corrected area A2 is formed. Specifically, a first CD (CD1 in FIG. 2A) between two adjacent general light-blocking patterns 120 may be greater than a seventh CD CD7, which is a CD between the corrected light-blocking pattern 120d and the general light-blocking pattern 120 in the second corrected area A2. Also, the CD obtained before the second corrected area A2 is formed may be equal to the first CD CD1 and greater than the seventh CD CD7 obtained after the second corrected area A2 is formed. It will be understood that when a CD on the photomask is greater than required (e.g., targeted), the CD of the corresponding region may be reduced by forming the second corrected area A2 in the corresponding light-blocking pattern portion. A CD reduction of the portion corresponding to the second corrected area A2 due to a correction process using the formation of the correction layer 125 will be described below in further detail with reference to FIGS. 14A and 14B.

Reducing the CD of the portion corresponding to the second corrected area A2 due to the correction process using the formation of the correction layer 125 may be controlled to be in the range of several nm or less. For example, reducing the CD of the portion corresponding to the second corrected area A2 due to the correction process using the formation of the correction layer 125 may be controlled to be in the range of about 4 nm or less. In this case, assuming that the photomask is a photomask used for a 4:1 reduction projection, reducing a CD of a pattern formed on a wafer may be controlled to be in the range of about 1 nm or less. In other words, when a CD error occurs in the pattern formed on the wafer in the range of about 1 to 2 nm or less than 1 nm, the CD error on the wafer may be eliminated by forming the correction layer 125 in the corresponding portion of the photomask 100 so that the distribution of CDs of patterns formed on the wafer may be improved.

As appreciated by the present inventors, when a CD on a photomask 100 is less than a required (e.g., targeted) CD or an unnecessary fine open region is provided, the errors may be eliminated by forming a material layer directly on an erroneous region of a light-blocking pattern by using e-beams. However, a method of directly forming the material layer on the erroneous region by using e-beams may not be used when a size of the erroneous region is small as described with reference to the methods removing portions of light-blocking pattern using e-beams. For example, methods forming the material layer directly on light-blocking pattern by using e-beams may not be used to correct CDs of patterns in the range of about 20 nm or less.

The second corrected area A2, in which the correction layer 125 is formed, may be formed in the corrected light-blocking pattern 120d, thereby embodying the photomask 100j of which a CD is corrected in the second corrected area A2 in a range of several nm or less. Also, since the photomask 100j of which a CD is corrected in a range of several nm or less may be used to form patterns on a wafer, a CD of the patterns formed on the wafer may be corrected in a range of several nm or less, for example, about 1 nm. Thus, the distribution of CDs of the patterns formed on the wafer may be improved.

In addition, although a structure in which the ARC layer 124 is disposed on the absorber layer 122 has been described with reference to FIGS. 7A to 7C, the ARC layer 124 may be omitted. When the ARC layer 124 is omitted, the second corrected area A2 may be embodied by forming the correction layer 125 directly on a top surface of the absorber layer 122. The ARC layer 124 may be omitted in some embodiments described below.

Figure 8A:
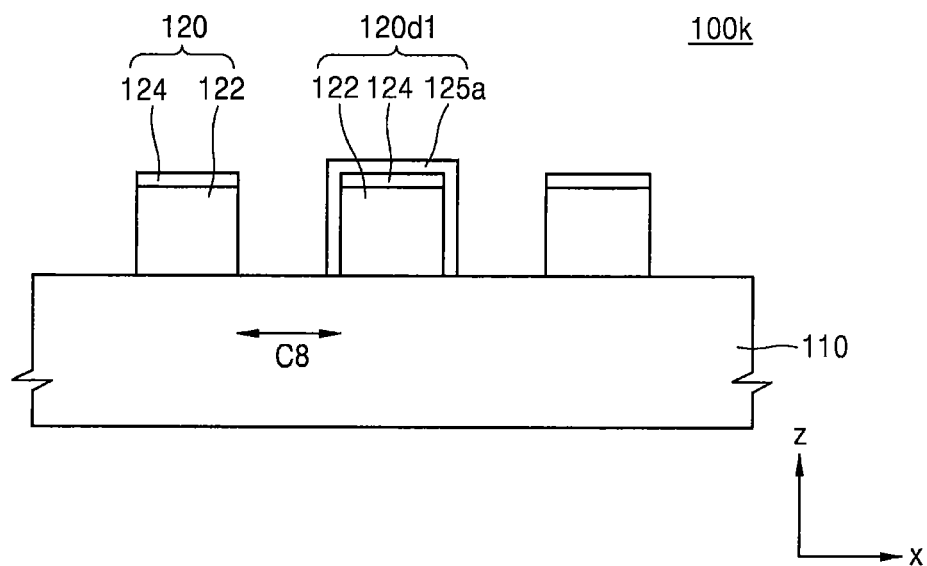
FIGS. 8A to 8C are cross-sectional views of modified examples of FIG. 7B, which are taken along the line IV-IV' of the photomask of FIG. 7A.
Figure 8B:
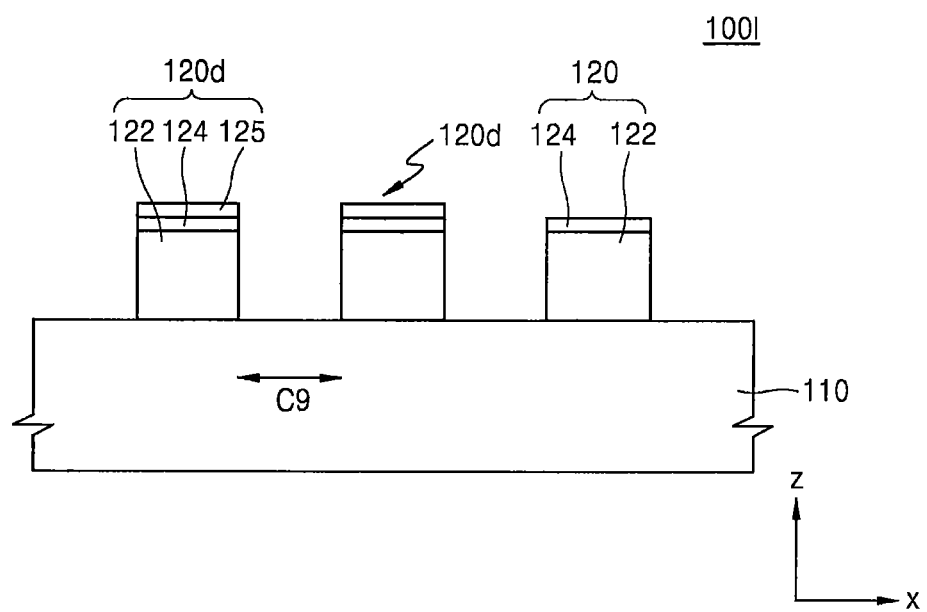
Figure 8C:
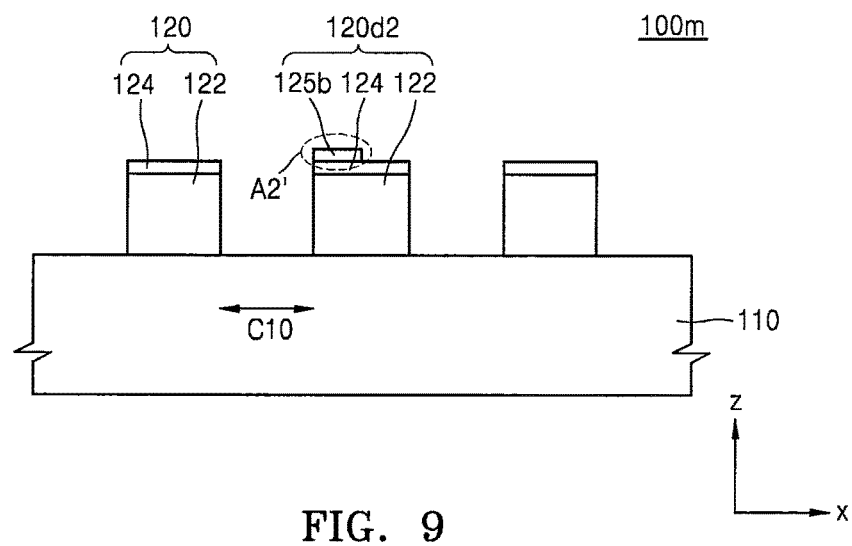

FIGS. 8A to 8C are cross-sectional views of modified examples of FIG. 7B, which are taken along the line IV-IV' of the photomask 100j of FIG. 7A. For brevity, the modified examples will be described with further reference to FIGS. 7A to 7C, and the same descriptions as provided above are simplified or omitted.

Referring to FIG. 8A, in a photomask 100k, a correction layer 125a may be formed not only on a top surface of an ARC layer 124 but also on both side surfaces of an absorber layer 122 and an ARC layer 124 in a second corrected area A2 of a corrected light-blocking pattern 120d1. For example, the correction layer 125a may be formed to surround the absorber layer 122 and the ARC layer 124. In some cases, the correction layer 125a may be formed on the top surface of the ARC layer 124 and only one of the side surfaces of the absorber layer 122 and the ARC layer 124.

A CD in the second corrected area A2 may be an eighth CD CD8. The eighth CD CD8 may be less than the first CD CD1 of FIG. 2A and less than the seventh CD CD7 of FIG. 7B because the CD is reduced in proportion to a thickness of the correction layer 125a formed on the side surfaces of the absorber layer 122 and the ARC layer 124. Also, the CD may decrease due to a reduction in intensity caused by a reduction in transmission rate of an absorber layer, and a reduction in intensity caused by a reduction in the amount of obliquely incident light. Accordingly, the eighth CD CD8 of the second corrected area A2 may be less than the seventh CD CD7 of the second corrected area A2 of FIG. 7B in which the correction layer 125 is formed only on the top surface of the ARC layer 124.

Referring to FIG. 8B, in a photomask 100l, second corrected areas A2 may be formed in adjacent two corrected light-blocking patterns 120d. A CD between the two second corrected areas A2 may be a ninth CD CD9, which may be less than the seventh CD CD7 of FIG. 7B that is a CD between the corrected light-blocking pattern 120d and the general light-blocking pattern 120. This effect may be obtained because a CD reduction caused by a reduction in transmission rate and a CD reduction caused by a reduction in the amount of obliquely incident light may further increase due to the two second corrected areas A2.

Although examples in which one or two second corrected areas A2 are formed have been described, the photomasks according to some embodiments are not limited to forming one or two second corrected areas A2. For example, three or more second corrected areas A2 may be formed in a photomask according to a number of portions of which CDs need to be corrected. Also, when a plurality of second corrected areas A2 are formed, multiple second corrected areas A2 may be disposed in adjacent corrected light-blocking patterns 120d as shown in FIG. 8B or disposed in the corrected light-blocking patterns 120d adjacent one another.

Referring to FIG. 8C, in a photomask 100m, a light-blocking pattern may include a general light-blocking pattern 120 and a corrected light-blocking pattern 120d2 in which a second corrected area A2' is formed. A shape of the second corrected area A2' formed in the corrected light-blocking pattern 120d2 may be different from the shape of the second corrected area A2 formed in the corrected light-blocking pattern 120d of the photomask 100j of FIG. 7A. Specifically, the second corrected area A2' may include a correction layer 125b formed on an ARC layer 124, and the correction layer 125b may be formed to correspond not to the entire width of the corrected light-blocking pattern 120d2 but to a portion of the width thereof in a first direction (x direction). As shown in FIG. 8C, the second corrected area A2' may be formed only in a left upper portion of the corrected light-blocking pattern 120d2. Thus, the ARC layer 124 may be covered with the correction layer 125b in the left upper portion of the corrected light-blocking pattern 120d corresponding to the second corrected area A2', while the ARC layer 124 may be exposed in a right upper portion of the corrected light-blocking pattern 120d.

When the second corrected area A2' is partially formed in a widthwise direction (i.e., transverse direction) of the corrected light-blocking pattern 120d2, the first direction (x direction), a CD of a portion corresponding to the second corrected area A2' may be a tenth CD CD10, and the tenth CD CD10 may be smaller than the first CD CD1 of FIG. 2A and greater than the seventh CD CD7 of FIG. 7B. It will be understood that the CD of the corresponding portion may be more minutely corrected by partially forming the second corrected area A2' in the widthwise direction of the corrected light-blocking pattern 120d.

Although several photomasks 100k, 100l, and 100m including the second corrected areas A2 have been described, a photomask including the second corrected area A2 according to the present embodiment is not limited to the above-described structures. For example, the photomask including the second corrected area A2 may have various structures, such as the photomasks including the first corrected areas A1 shown in FIGS. 3A to 5B.

Figure 9:
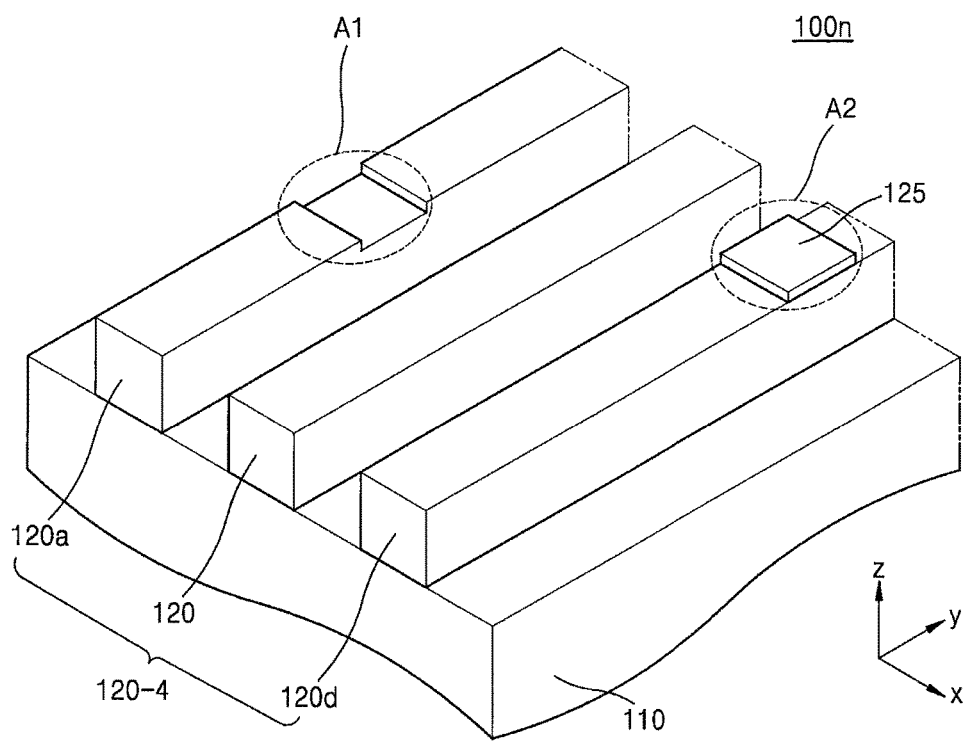
FIG. 9 is a schematic perspective view of a portion of a photomask according to example embodiments of the inventive concept.

FIG. 9 is a schematic perspective view of a portion of a photomask 100n according to example embodiments of the inventive concept. For brevity, the photomask 100n will be described with further reference to FIGS. 1 to 8C, and the same descriptions as provided above are simplified or omitted.

Referring to FIG. 9, the photomask 100n may include a substrate 110 and a light-blocking pattern 120-4. The light-blocking pattern 120-4 may include a general light-blocking pattern 120, a first corrected light-blocking pattern 120a, and a second corrected light-blocking pattern 120d. The substrate 110 and the general light-blocking pattern 120 may be the same as described above with reference to FIG. 1.

The first corrected light-blocking pattern 120a may correspond to the corrected light-blocking pattern 120a of the photomask 100 of FIG. 1. Thus, a first corrected area A1 may be formed in the first corrected light-blocking pattern 120a. The first corrected area A1 may be formed by removing a portion of an ARC layer 124 or a portion of an ARC layer 124 and a portion of an upper portion of an absorber layer 122 disposed under the ARC layer 124 by using an etching process.

The second corrected light-blocking pattern 120d may correspond to the corrected light-blocking pattern 120d of the photomask 100j of FIG. 7A. Thus, a second correction pattern A2 may be formed in the second corrected light-blocking pattern 120d. The second corrected area A2 may be embodied by forming a correction layer 125 on the ARC layer 124.

The photomask 100n may include both the first corrected area A1 and the second corrected area A2. Although the photomask 100n including one first corrected area A1 and one second corrected area A2 is shown, a number of first corrected areas A1 and a number of second corrected areas A2 are not limited thereto. For example, in the photomask 100n, a plurality of first corrected areas A1 and a plurality of second corrected areas A2 may be formed according to a number of portions of which CDs need to be corrected.

The photomasks described with reference to FIGS. 1 to 9 may be transmissive photomasks in which light is blocked by dark patterns and transmitted through clear patterns. However, photomasks according to some embodiments are not limited to transmissive photomasks. For example, CDs may be corrected by forming the above-described first or second corrected areas in reflective photomasks. Hereinafter, reflective photomasks including corrected areas will briefly be described with reference to FIGS. 10A and 10B.

Figure 10A:
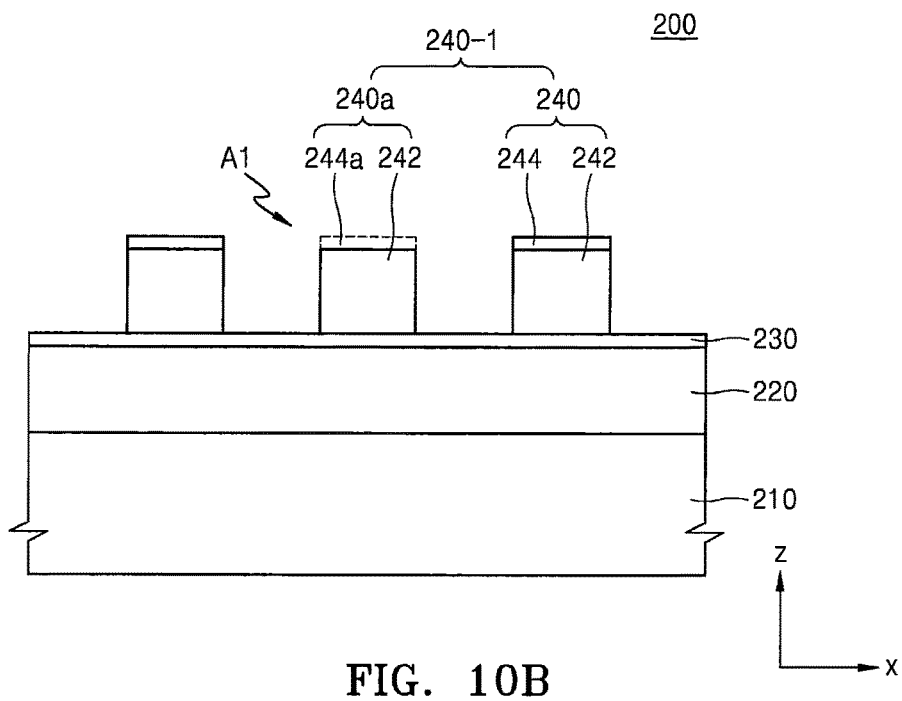
FIGS. 10A and 10B are cross-sectional views of a reflective photomask according to example embodiments of the inventive concept.
Figure 10B:
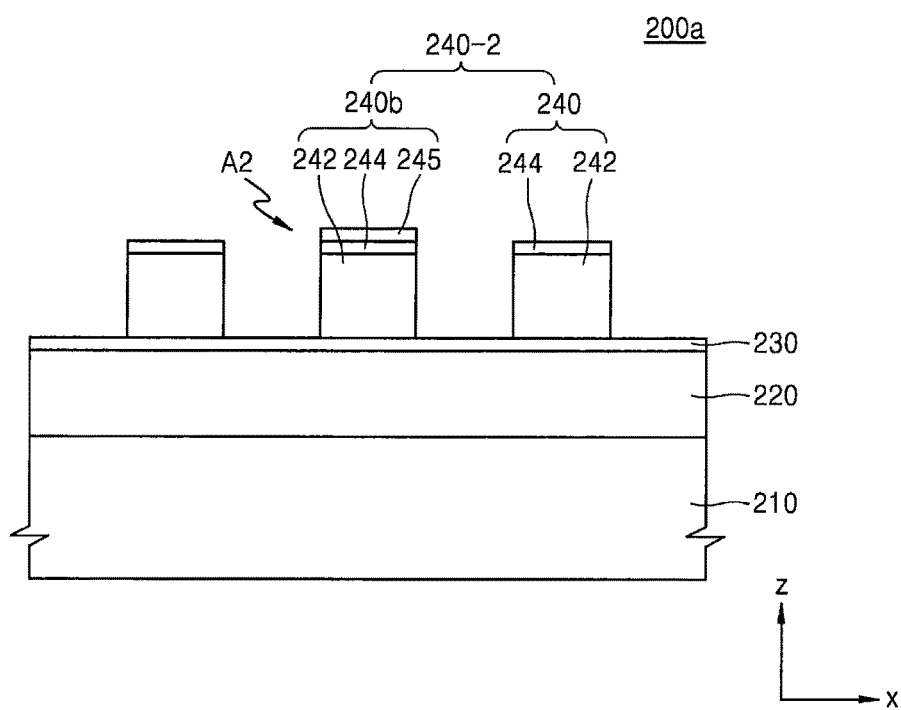

FIGS. 10A and 10B are cross-sectional views of reflective photomasks according to example embodiments of the inventive concept.

Referring to FIG. 10A, a photomask 200, which is a reflective photomask, may include a substrate 210, a reflective layer 220, and a light-blocking pattern 240-1. The substrate 210 may be a glass or quartz substrate as described above with reference to the photomask 100 of FIG. 1.

The reflective layer 220 may be formed on the substrate 110 and may function to reflect incident light. That is, as shown in FIG. 10A, the light-blocking pattern 240-1 may be formed on the reflective layer 220, and the reflective layer 220 may be exposed between light-blocking patterns 240-1. Similarly, in the reflective photomask, the light-blocking patterns 240-1 may correspond to dark patterns, while the exposed portion of the reflective layer 220 may correspond to a clear pattern. However, the reflective photomask may differ from the transmissive photomask in that light incident to the clear pattern is not transmitted but reflected.

The reflective layer 220 may have a multilayered structure obtained by repetitively stacking 30 to 60 Mo/Si layers. As shown in FIG. 10A, a capping layer 230 may be formed on a top surface of the reflective layer 220 to protect the reflective layer 220. The capping layer 230 may be formed of, for example, ruthenium oxide (RuO). In some embodiments, the capping layer 230 may be omitted.

Like a transmissive photomask, the light-blocking pattern 240-1 may include an absorber layer 242 and an ARC layer 244. In some embodiments, the ARC layer 244 may be omitted. Although the absorber layer 242 may be formed of an inorganic material or a metal included in an absorber layer of a transmissive photomask, in some embodiments, the absorber layer 242 may be mainly formed of a tantalum (Ta)-based compound. For example, the absorber layer 242 may be formed of TaN, TaBN, or TaBON. It will be understood that the absorber layer 242 may be formed of other metals, such as aluminum, chromium, or tungsten.

Like a transmissive photomask, the light-blocking pattern 240-1 may include a general light-blocking pattern 240 and a corrected light-blocking pattern 240a, and a first corrected area A1 may be formed in the corrected light-blocking pattern 240a. The first corrected area A1 may be formed by removing a portion of the ARC layer 244 or a portion of the ARC layer 244 and a portion of an upper portion of the absorber layer 242 disposed under the ARC layer 244. By forming the first corrected area A1 in the corrected light-blocking pattern 240a, a CD of the corresponding portion may be corrected (i.e., increased). A CD increase due to the formation of the first corrected area A1 may be based on a similar principle to a CD increase due to the formation of the first corrected area A1 in the transmissive photomask.

For example, the first corrected area A1 may be formed to increase a transmission rate in the first corrected area A1, and the amount of obliquely incident light may be increased to increase the amount of light reflected by the clear pattern. An increase in the amount of reflected light may contribute to increasing the CD.

Referring to FIG. 10B, a photomask 200a may be similar to the photomask 200 of FIG. 10A, except that a second corrected area A2 is formed in a corrected light-blocking pattern 240b. That is, a correction layer 245 may be formed on an ARC layer 244 in the second corrected area A2. Materials or shapes of the correction layer 245 may be the same as described with reference to FIGS. 7A to 7C.

In the photomask 200a, a CD of the corresponding portion may be corrected (i.e., reduced) by forming the second corrected area A2. A CD reduction due to the formation of the second corrected area A2 may be based on a similar principle to a CD reduction due to the formation of the second corrected area A2 in the transmissive photomask.

In addition, although the reflective photomasks 200 and 200a, in which the first corrected area A1 and the second corrected area A2 are formed, have been described above, various structures of the transmissive photomasks described above as examples with reference to FIGS. 3A to 6C and 8A to 8C may also be applied to reflective photomasks.

Although photomasks having various structures have been described above with reference to various embodiments, a structure of a photomask according to the inventive concept is not limited to the embodiments. For example, any photomask structure in which a first corrected area is embodied by removing part of a top surface of a light-blocking pattern and/or any photomask structure in which a second corrected area is embodied by forming a correction layer on a top surface of a light-blocking pattern may be included in the inventive concept.

Figure 11A:
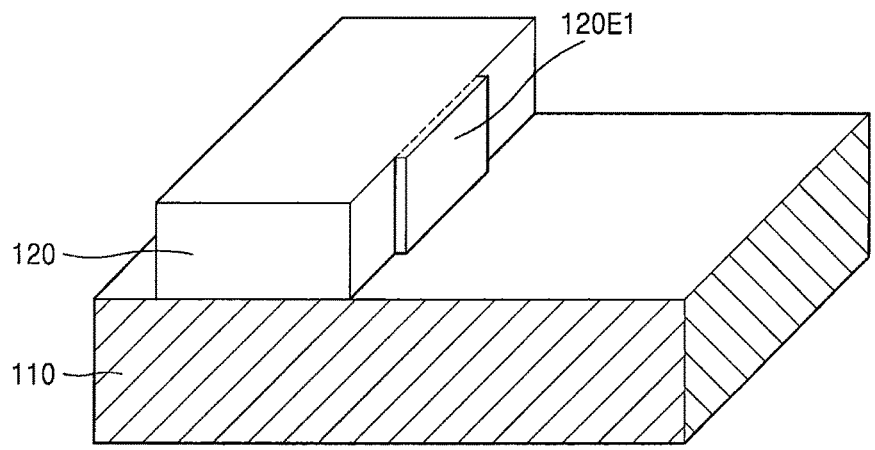
FIGS. 11A to 11C are perspective views illustrating a process of correcting a critical dimension (CD) of a pattern of a photomask according to example embodiments of the inventive concept.
Figure 11B:
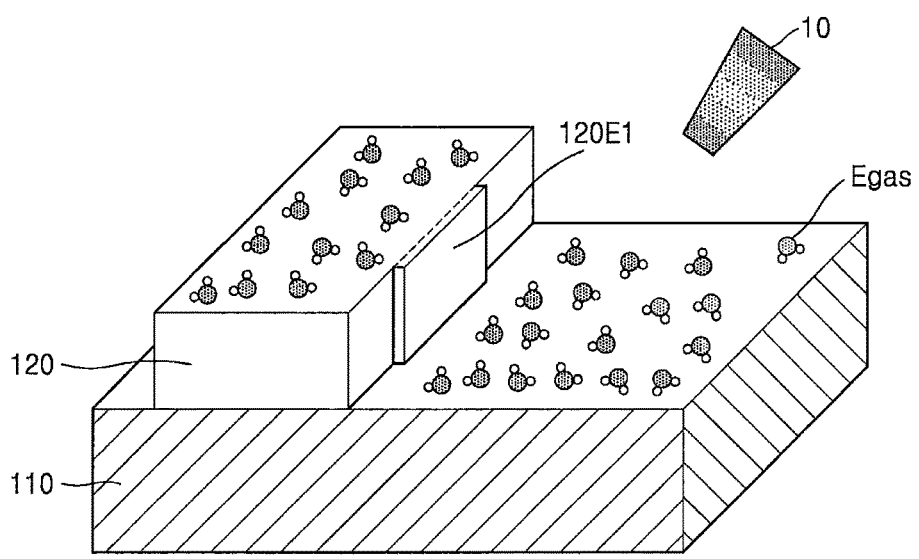
Figure 11C:
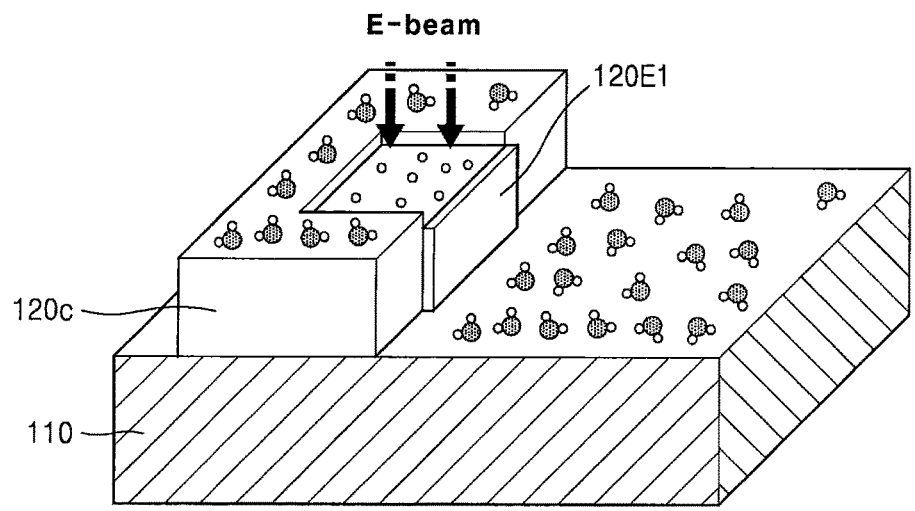

FIGS. 11A to 11C are perspective views illustrating a process of correcting a CD of a pattern of a photomask, according to example embodiments of the inventive concept.

Referring to FIG. 11A, a plurality of general light-blocking patterns 120 may be formed on a substrate 110 at predetermined intervals. As shown in FIG. 11A, a protruding erroneous region 120E1 may be disposed on any one of the general light-blocking patterns 120. Due to the erroneous region 120E1, a CD between adjacent general light-blocking patterns may become poor. The erroneous region 120E1 may protrude by a thickness of several nm or less. When the erroneous region 120E1 has a small thickness as described above, removing the erroneous region 120E1 using e-beams may be inappropriate because there is a good possibility of removing not only the erroneous region 120E1 but also a peripheral region thereof. Accordingly, in a method of correcting CDs of patterns formed on a photomask, according to example embodiments, the CDs may be indirectly corrected as described below with reference to FIGS. 11B and 11C.

Referring to FIG. 11B, a photomask may be placed in a chamber that is in a vacuum state, and an etch gas Egas that is in an inert state may be sprayed. The etch gas Egas may be gas containing a halogen element, for example, a fluorine-containing gas, a chlorine-containing gas, a bromine-containing gas, or an iodine-containing gas. The etch gas Egas may be appropriately selected according to materials of an etch target layer. For example, when the etch target layer is formed of Cr or CrO, a chlorine-containing gas, such as $CCl_4$, $C_2Cl_4$, or $C_2H_2Cl_2$, or a fluorine-containing gas, such as $CF_4$ or $XeF_2$, may be used as the etch gas Egas.

The sprayed etch gas Egas, which is in an inert state, may be diffused onto the surfaces of the general light-blocking pattern 120 and the substrate 110 and adsorbed as a monolayer type. Although FIG. 11B illustrates a case in which the etch gas Egas is adsorbed only on top surfaces of the general light-blocking pattern 120 and the substrate 110, the etch gas Egas may be absorbed on a side surface of the general light-blocking pattern 120 including the erroneous region 120E1. Since the etch gas Egas adsorbed as the monolayer type is in the inert state, the etch gas Egas may not react with the general light-blocking pattern 120 or the substrate 110. Here, reference numeral '10' denotes a spray nozzle configured to spray the etch gas Egas into the chamber.

Referring to FIG. 11C, e-beams may be irradiated to a top surface of the general light-blocking pattern 120 corresponding to the erroneous region 120E1. When the e-beams are irradiated, the etch gas Egas adsorbed on a irradiated region may be dissociated due to the e-beams and activated. The activated etch gas Egas (e.g., halogen element) may react with the general light-blocking pattern 120 and be modified into a volatile gas so that the top surface of the general light-blocking pattern 120 can be removed by etching to a predetermined thickness.

A first corrected area (e.g., A1' of FIG. 5A) may be formed by etching and removing a portion of the top surface of the general light-blocking pattern 120 to a predetermined thickness so that a corrected light-blocking pattern 120c including the first corrected area A1' can be formed. As described above, by forming the first corrected area A1', a CD of a portion corresponding to the erroneous region 120E1 may be increased without directly removing the erroneous region 120E1. For example, in the first corrected area A1', a portion having a thickness of several to tens of nm may be removed by etching. Thus, the CD of the corresponding portion may be increased in the range of several nm or less.

As shown in FIG. 5A, the first corrected area A1' may be partially formed in a widthwise direction of the corrected light-blocking pattern 120c. However, the first corrected area A1' is not limited thereto and may be formed to correspond to the entire width of the corrected light-blocking pattern 120c in the widthwise direction thereof, as shown in FIG. 1. Also, the first corrected area A1' may be formed in various other shapes, such as a semi-circular shape or a semi-elliptical shape. In addition, although an etching method using e-beams has been described above, FIBs may be used instead of e-beams. In some embodiments, laser beams may be used.

Figure 12A:
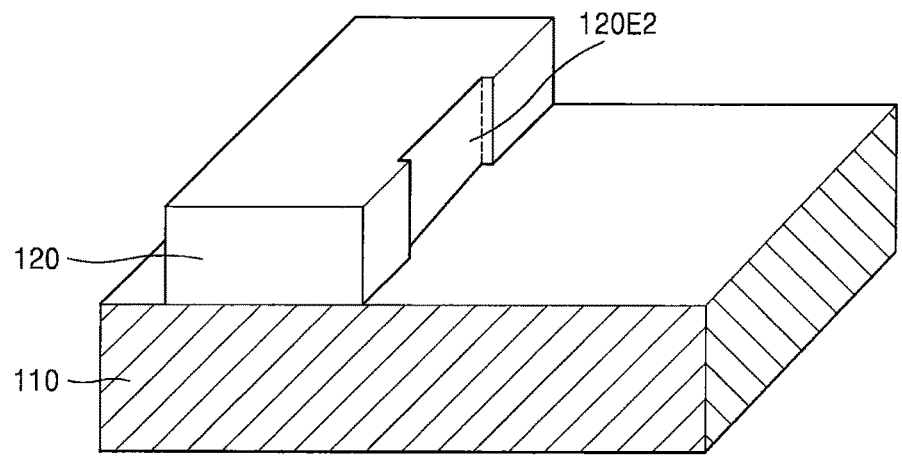
FIGS. 12A to 12C are perspective views illustrating a process of correcting a CD of a pattern of a photomask, according to example embodiments of the inventive concept.
Figure 12B:
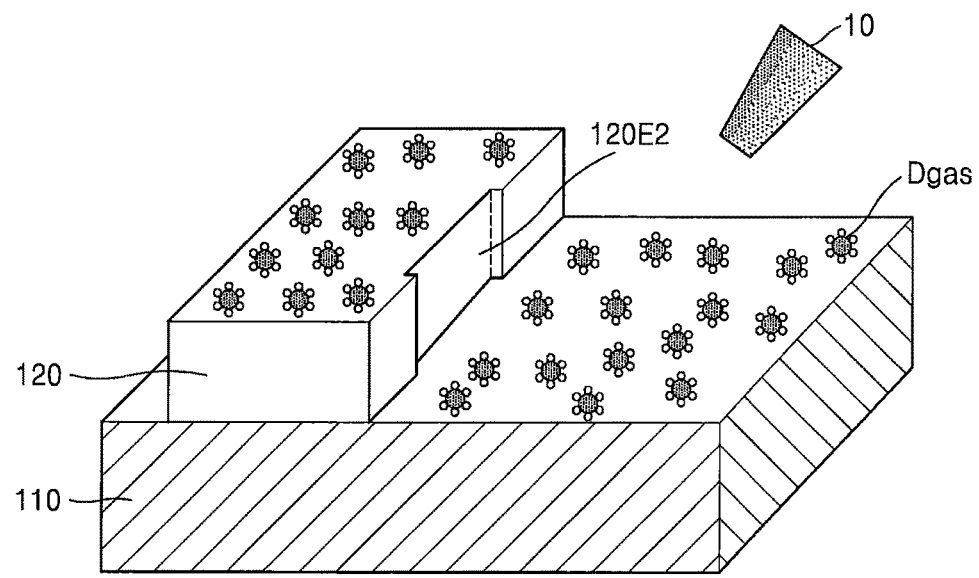
Figure 12C:
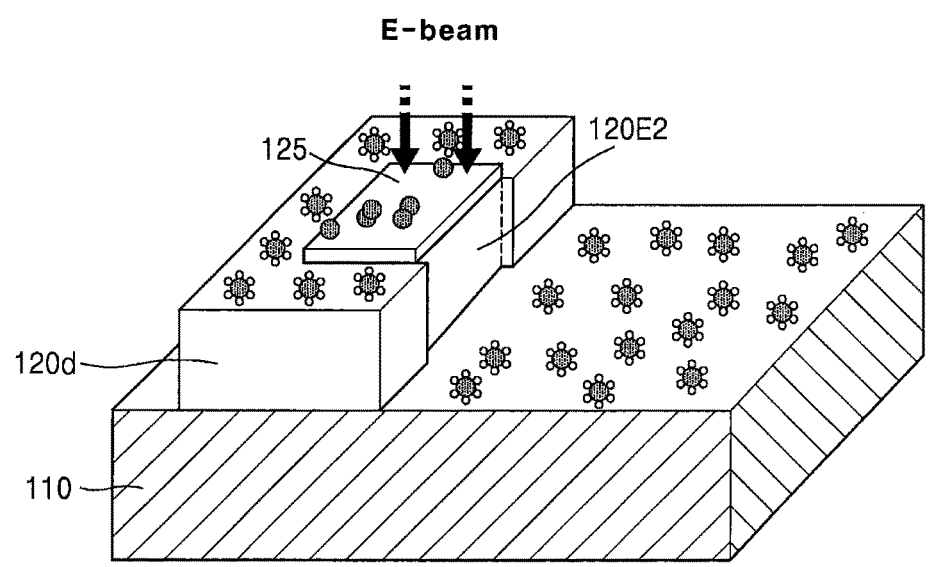

FIGS. 12A to 12C are perspective views illustrating a process of correcting a CD of a pattern of a photomask, according to an example embodiment of the inventive concept.

Referring to FIG. 12A, a plurality of general light-blocking patterns 120 may be formed on a substrate 110 at predetermined intervals. As shown in FIG. 12A, a depressed (e.g., recessed) erroneous region 120E2 may be disposed in a side surface of any one of the general light-blocking patterns 120. Due to the erroneous region 120E2, a CD between adjacent general light-blocking patterns may become poor. The erroneous region 120E2 may be depressed to a small depth of several nm or less. When the erroneous region 120E2 has a small depth as described above, a method of directly forming a material layer by using e-beams may be inappropriate to perform. Therefore, in a method of correcting CDs of patterns formed on a photomask, according to some embodiments, CDs may be indirectly corrected as described below with reference to FIGS. 12B and 12C.

Referring to FIG. 12B, the photomask may be disposed in a chamber that is in a vacuum state, and a deposition gas Dgas that is an inert state may be sprayed. The deposition gas Dgas may be gas containing elements of a material layer to be formed. For example, when the material layer to be formed is a metal layer formed of Au, Al, Ti, or Cu, gas containing the metal elements may be used as the deposition gas Dgas. Also, when the material layer to be formed is a silicon-containing silicon compound layer or a carbon-containing carbon compound layer, gas containing silicon or carbon may be used as the deposition gas. For example, when the material layer to be formed is a chromium (Cr) metal layer, $Cr(CO)_6$ gas may be used as the deposition gas Dgas.

The sprayed deposition gas Dgas, which is in an inert state, may be diffused onto the surfaces of the general light-blocking pattern 120 and the substrate 110 and adsorbed as a monolayer type. Also, the deposition gas Dgas may be adsorbed also on the side surface of the general light-blocking pattern 120 in which the erroneous region 120E2 is disposed. Here, a spray nozzle 10 may jet the deposition gas Dgas into the chamber.

Referring to FIG. 12C, e-beams may be irradiated onto a top surface of the general light-blocking pattern 120 corresponding to the erroneous region 120E2. When the e-beams are irradiated, the deposition gas Dgas adsorbed onto the radiated region may be dissociated due to the e-beams and activated. The activated deposition gas Dgas may react or combine with the general light-blocking pattern 120 to form a material layer. Thus, a correction layer 125 may be formed to a predetermined thickness on the top surface of the general light-blocking pattern 120.

A second corrected area (e.g., A2 in FIG. 7A) may be formed by forming a correction layer 125 on the top surface of the general light-blocking pattern 120 to a predetermined thickness so that a corrected light-blocking pattern 120d including the second corrected area A2 may be formed. As described above, by forming the second corrected area A2, a CD of a portion corresponding to the erroneous region 120E2 may be reduced without directly forming a material layer in the erroneous region 120E2. For example, a thickness of the second corrected area A2 may be increased by several to tens of nm due to the correction layer 125. Thus, the CD of the corresponding portion may be reduced in the range of several nm or less.

As shown in FIG. 8C, the second corrected area A2 may be partially formed in a widthwise direction of the corrected light-blocking pattern 120d. However, the second corrected area A2 is not limited thereto and may be completely formed in the widthwise direction of the corrected light-blocking pattern 120d, as shown in FIG. 7A. That is, the correction layer 125 may be formed to correspond to the entire width of the corrected light-blocking pattern 120d in the widthwise direction thereof. Also, a correction layer having various other shapes, such as a semi-circular shape or a semi-elliptical shape, may be formed in the second corrected area A2. Furthermore, as shown in FIG. 8A, the correction layer 125 may be formed to surround the general light-blocking pattern 120 in the second corrected area A2.

Figure 13A:
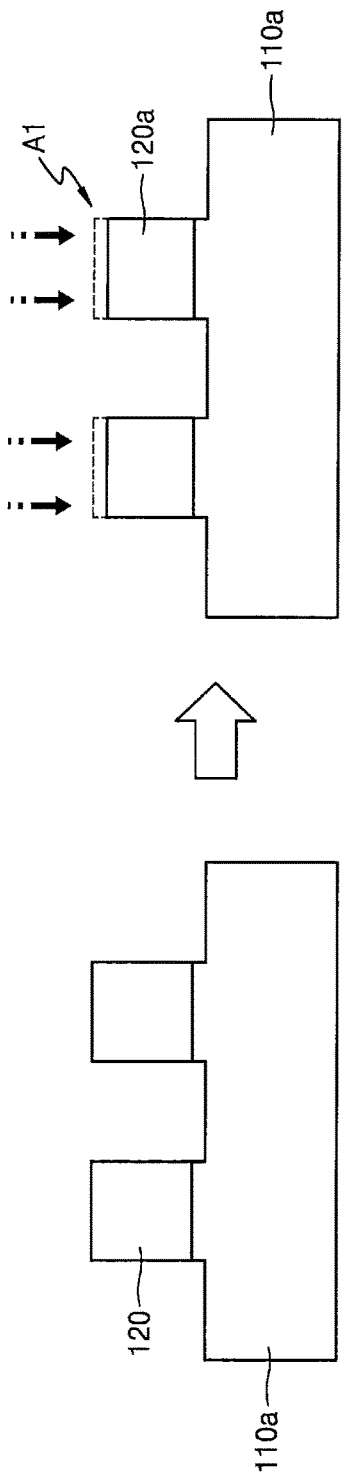
FIGS. 13A to 13C are cross-sectional views and graphs for explaining the effects of correction of CDs of patterns by using a method of etching a top surface of a light-blocking pattern of a photomask.
Figure 13B:
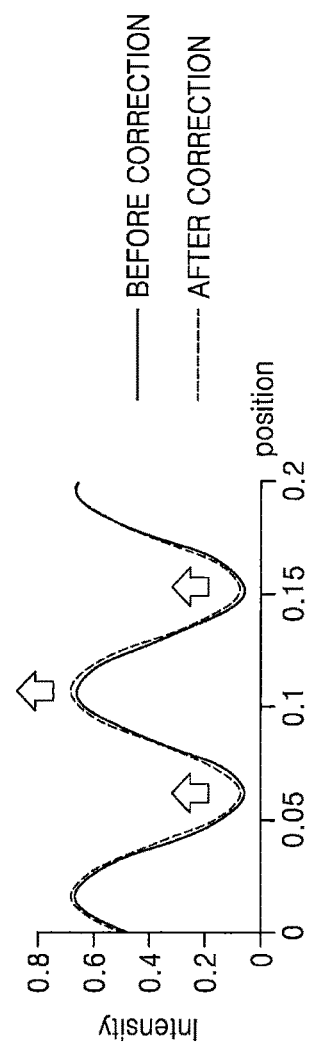
Figure 13C:
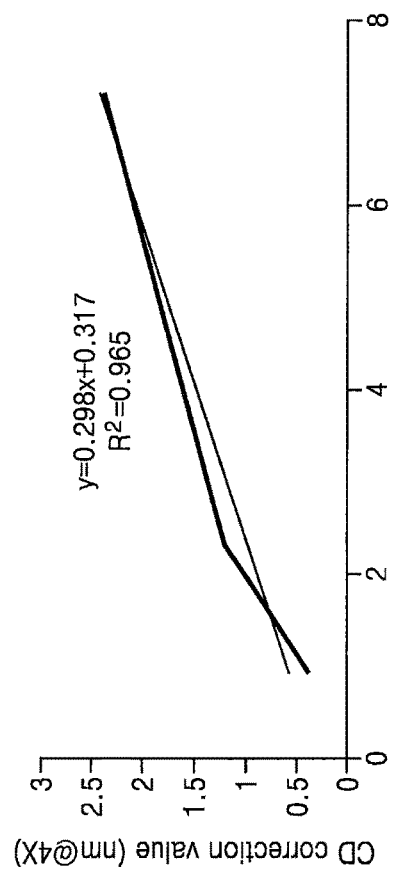

FIGS. 13A to 13C are cross-sectional views and graphs for explaining the effects of correction of CDs of patterns by using a method of etching a top surface of a light-blocking pattern of a photomask.

Referring to FIG. 13A, a portion of a top surface of a photomask (left) in which a general light-blocking pattern 120 is formed on a substrate 110a may be removed by means of an etching method using e-beams. Thus, it can be seen that the photomask (left) is modified into a photomask (right) in which a corrected light-blocking pattern 120a is formed on the substrate 110a. That is, the corrected light-blocking pattern 120a may include a first corrected area A1 obtained by removing a portion of a top surface of the general light-blocking pattern 120 by using an etching process. The photomask may have a substrate-etching-type photomask structure in which a portion of an upper portion of the substrate 110a is etched in a clear pattern portion. It will be understood that the photomask may have a typical structure in which a portion of the upper portion of the substrate is not etched.

FIG. 13B shows the intensity (solid line) of light transmitted through the photomask (left of FIG. 13A) including the general light-blocking pattern 120 before correction and the intensity (dashed line) of light transmitted through the photomask (right of FIG. 13A) including the corrected light-blocking pattern 120a after correction. In FIG. 13B, the abscissa denotes a position (μm), and the ordinate denotes a light intensity (arbitrary unit).

Referring to FIG. 13B, it can be seen that a portion of a dark pattern corresponding to the general light-blocking pattern 120 or the corrected light-blocking pattern 120a has a low intensity, while a portion of a clear pattern corresponding to a space between the general light-blocking patterns 120 or a space between the corrected light-blocking patterns 120a has a high intensity. Also, as denoted by three thick arrows, it can be seen that the intensity of the photomask including the corrected light-blocking pattern 120a is slightly higher than the intensity of the photomask including the general light-blocking pattern 120 in the entire section including the dark pattern and the clear pattern.

In the case of the dark pattern portion, since the corrected light-blocking pattern 120a has a smaller thickness than the general light-blocking pattern 120, a transmission rate of light may be minutely increased. Also, in the clear pattern portion, the influence of an increase in the transmission rate in the dark pattern portion may be reflected, and the amount of obliquely incident light may be minutely increased. An increase in the intensity of transmitted light may contribute to increasing a CD of the corresponding clear pattern portion. As a result, the first corrected area A1, from which a portion of a top surface is removed, may be formed in the corrected light-blocking pattern 120a so that the CD of the clear pattern corresponding to the first corrected area A1 can be increased.

FIG. 13C shows a CD variation or CD correction value according to an etch depth or etched thickness of the first corrected area A1 formed in the corrected light-blocking pattern 120a of the photomask. In FIG. 13C, the abscissa denotes an etch depth (nm), and the ordinate denotes a CD correction value (nm). On the ordinate, @4× in parentheses indicates that a CD correction value of the photomask is 4 times greater than the CD correction value on a wafer. That is, it can be seen that the photomask is a photomask configured to form patterns on the wafer by using a 4:1 reduction projection.

Referring to FIG. 13C, it can be seen that a CD correction value according to an etch depth varies almost linearly. For example, a curve (thick solid line) of a CD correction value according to etch depth may approximately be a line (thin solid line) of 'y=0.298x+0.317'. Also, based on a value $R^2$ (=0.965), it can be seen that the etch depth is closely related to the CD correction value. Here, R refers to a Pearson's simple product-moment correlation coefficient. It may be inferred that as R approaches 1, there is a higher correlation between two variables (i.e., the etch rate and the CD correction value).

Accordingly, according to the analysis of results of FIGS. 13B and 13C, since $R^2$ approaches 1, it can be seen that there is a very high correlation between the etch depth of the first corrected area A1 and the CD correction value and the depth etch directly affects the CD correction value. Also, since the CD correction value varies almost linearly according to the etch depth, it can be seen that the CD correction value may be precisely controlled by adjusting the etch depth of the first corrected area A1.

Figure 14A:
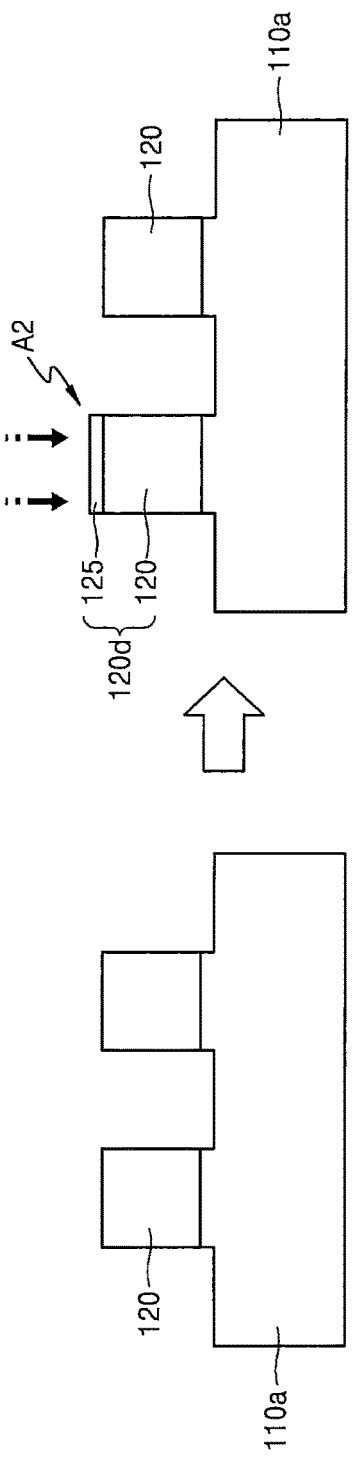
FIGS. 14A and 14B are a cross-sectional view and a graph for explaining the effects obtained by correcting a CD of a pattern by using a method of forming a correction layer on a top surface of a light-blocking pattern of a photomask, respectively.
Figure 14B:
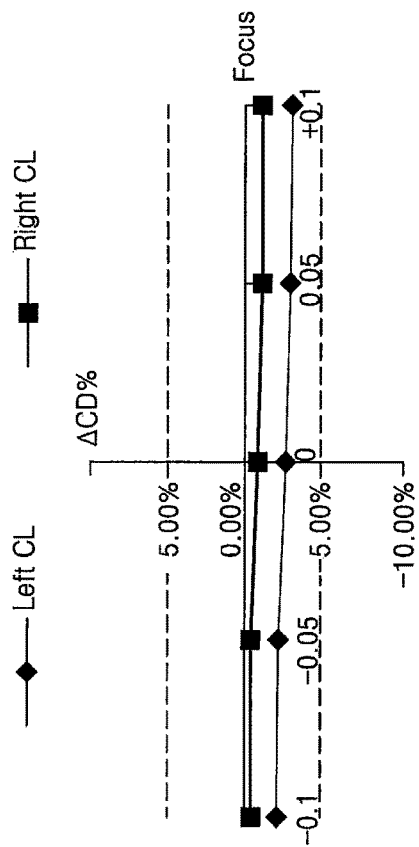

FIGS. 14A and 14B are a cross-sectional view and graph for explaining the effects obtained by correcting a CD of a pattern by using a method of forming a correction layer on a top surface of a light-blocking pattern of a photomask.

Referring to FIG. 14A, a photomask (left) in which a general light-blocking pattern 120 is formed on a substrate 110a may be corrected using a method of forming a material layer by using e-beams. Thus, it can be seen that the photomask (left) is modified into a photomask (right) in which a corrected light-blocking pattern 120d is formed on the substrate 110a. That is, the corrected light-blocking pattern 120d may include a second corrected area A2, in which a correction layer 125 is formed on the general light-blocking pattern 120. The photomask may have a substrate-etching-type photomask structure in which a portion of an upper portion of the substrate 110a is etched in a clear pattern portion. It will be understood that the photomask may have a typical structure in which a portion of the upper portion of the substrate is not etched.

FIG. 14B shows variations in CDs of left and right clear patterns of the corrected light-blocking pattern 120d according to the focus of a light source in the photomask (the right of FIG. 14A) including the corrected light-blocking pattern 120d after correction. In FIG. 14B, the abscissa denotes a focus position (μm), and the ordinate denotes a CD variation (%). The correction layer 125 formed in the second corrected area A2 of the corrected light-blocking pattern 120d has a thickness of about 10 nm.

Referring to FIG. 14B, it can be seen that the CDs decrease to be less than a reference CD (a point of 0.00% in the graph) after correction. That is, it can be seen that the CD variations slightly vary according to the focus position. Here, the focus may refer to the focus of the light source on a photomask during an exposure process. Specific numerical values of the CD variation of the left clear pattern may be shown as in the following Table 1:

TABLE 1

| Focus(nm) | Ref.(nm) | After correction(nm) | ΔCD(nm) |
|---|---|---|---|
| 100 | 45.3 | 43.9 | −1.4 (−3.1%) |
| 50 | 45.4 | 44.1 | −1.3 (−2.9%) |
| Best | 45.4 | 44.2 | −1.2 (−2.6%) |
| −50 | 45.3 | 44.3 | −1.0 (−2.2%) |
| −100 | 45.2 | 44.3 | −0.9 (−2.0%) |

Here, 'Best' indicates an in-focus position, a positive (+) value indicates that the focus position is located above the photomask, and a negative (−) value indicates that the focus position is located under the photomask. As can be seen from Table 1, all CDs of clear patterns decrease due to a correction process using the formation of the correction layer 125. It can be seen that as the light source distances from the photomask, the CD variations increase. Thus, it can be inferred that as the light source distances from the photomask, the intensity of light decreases and a variation in transmission rate relative to the thickness of a light-blocking pattern increases.

Accordingly, based on the above-described experimental results, it can be seen that the CD of the corresponding region may be reduced by forming the second corrected area A2 including the correction layer 125 in the corrected light-blocking pattern 120d.

Figure 15:
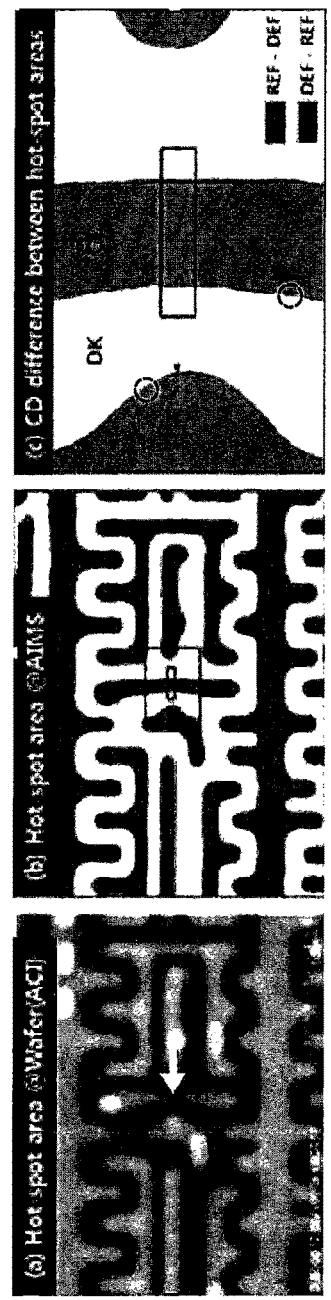
FIG. 15 shows an image of a shape of a pattern of a hot-spot area on a wafer and an aerial image and an enlarged image of the corresponding photomask.

FIG. 15 shows an image of a shape of a pattern of a hot-spot area on a wafer and an aerial image and an enlarged image of the corresponding photomask.

Referring to FIG. 15, a left photograph is an image of the hot-spot area on the wafer, and a portion denoted by an arrow is a hot-spot pattern, which is a portion in which errors occur. For example, a white portion pointed by the arrow should be connected. However, the white portion is cut due to errors of a photomask pattern or errors of an exposure system. Here, 'ACI', which is an abbreviation of After Clean Inspection, refers to an image obtained after a pattern is formed on a wafer and a cleaning process is finished. Patterns formed on a wafer may be inspected using After Develop Inspection (ADI), which is an image obtained after a developing process, instead of ACI. In the image of the hot-spot area on the wafer, a dark portion may correspond to an interconnection layer (e.g., metal layer), while the white portion may correspond to an insulating layer disposed around the interconnection layer.

A middle image is an image of the intensity of light transmitted through a photomask corresponding to the hot-spot area of the left image, which is captured using an AIMS apparatus. For example, in the intensity image, a dark portion is a portion having a high intensity, and a white portion is a portion having a low intensity. That is, the intensity image is an inversion of the left image. In addition, the portion having the high intensity may be a portion through which light has been transmitted, and removed when photoresist formed on the wafer is irradiated with light and developed. From the intensity image, it can be seen that even the cut portion of the hot-spot pattern of the left image has a high intensity and a connected shape.

A right image is an enlarged image of the hot-spot pattern, which shows a CD difference between a reference image and a defective image in the corresponding portion with colors. Here, DK denotes a dark pattern, and CL denotes a clear pattern. That is, a DK portion is a portion having a low intensity, and a CL portion is a portion having a high intensity. Deep dark interfaces indicate that a CD of the defective image is minutely smaller than a CD of the reference image, and interfaces corresponding to dashed circles indicate that a CD of the reference image is minutely smaller than a CD of the defective image.

Figure 16:
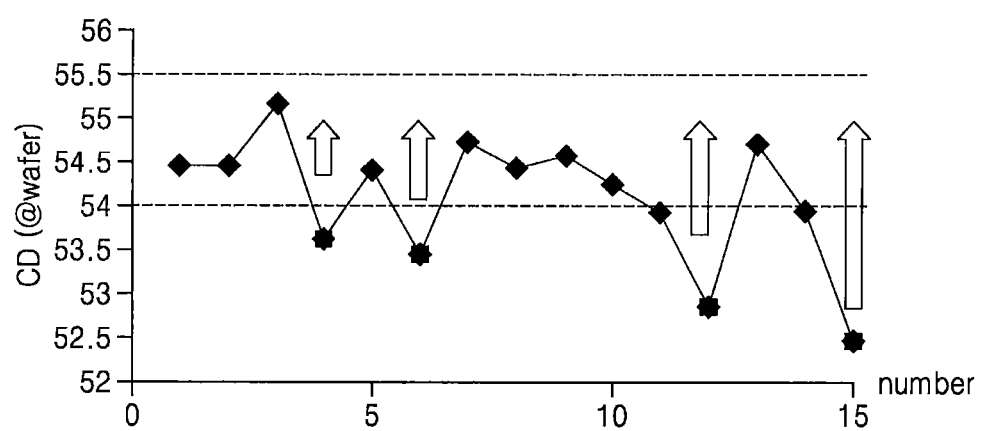
FIG. 16 is a graph showing the distribution of CDs of a hot-spot pattern of FIG. 15.

FIG. 16 is a graph showing the distribution of CDs of the hot-spot pattern of FIG. 15.

FIG. 16 shows CDs of 15 equal patterns formed on the entire surface of the photomask, which are selected to correspond to the hot-spot pattern of FIG. 15. Here, the abscissa denotes the number of respective patterns, and the ordinate denotes CDs (nm) of the respective patterns. The CDs of the patterns were measured in a wafer-level CD (WLCD) apparatus. To reduce measurement errors due to the reproducibility limit of equipment, the CDs of the patterns were repetitively measured 10 times and the average CDs were taken.

When the CDs of the hot-spot patterns are in a normal range or target range of 54 nm to 55.5 nm, it can be seen from FIG. 16 that four points deviated from the target range. Also, since all the CDs of the four points of the hot-spot pattern are less than the target range, the CDs need to be increased as denoted by arrows. Thus, the CDs are corrected by forming the first corrected area A1 according to some embodiments in the four points of the hot-spot pattern, of which the CDs deviate from the target range. That is, the CDs may be increased using a correction process of removing a portion of a top surface of the light-blocking pattern by etching. A correction process and results thereof will be described below with reference to FIGS. 17A to 17C.

Figure 17A:
FIGS. 17A to 17C are images of a depth profile of a photomask on which a process of correcting CDs has been performed to improve CDs and CD differences before and after the correction of the CDs.
Figure 17B:
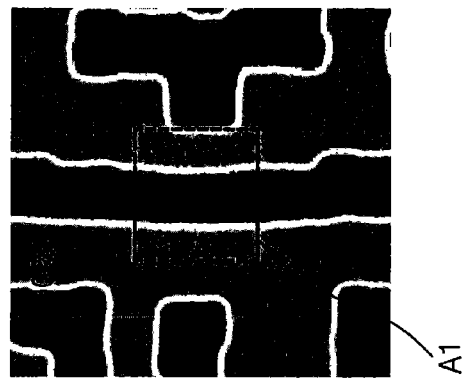
Figure 17C:

FIGS. 17A to 17C are images of a depth profile of a photomask on which a process of correcting CDs has been performed to improve CDs, and CD differences before and after the correction of the CDs.

FIG. 17A is an image showing a difference in intensity between a hot-spot pattern (normal hot-spot pattern) falling within a target range and a hot-spot pattern (erroneous hot-spot pattern) deviating from the target range before CD correction. From white portions in the center of the image, it can be seen that there is a large difference between the normal hot-spot pattern and the erroneous hot-spot pattern. In other words, when the normal hot-spot pattern and the erroneous hot-spot pattern have the same intensity, the entire region of the image is denoted by similarly dark colors. However, when there is a difference in intensity in a portion of the image, the portion is denoted by a white color. As the difference in intensity increases, the portion of the image is denoted by a brighter white. Accordingly, it can be seen that there is a big difference in intensity in the center of the image. Thus, it may be inferred that the intensity of the erroneous hot-spot pattern is abnormal. More specifically, since the clear pattern (e.g., the right image of FIG. 15) in the center of the erroneous hot-spot pattern has a low intensity, there may be a big difference in intensity in the center of the image, and lower CDs than in the target range may be caused.

FIG. 17B shows a depth profile obtained by removing a top surface of a peripheral dark pattern by etching to increase the intensity of a clear pattern of a central portion of an erroneous hot-spot pattern. Here, a dark portion is a portion corresponding to the clear pattern, and a gray portion is a portion corresponding to the dark pattern. Also, as illustrated by a dashed line, first corrected areas A1 are formed in portions of dark patterns on both sides of the central clear pattern. The first corrected areas A1 may be formed by etching the dark patterns (i.e., the top surface of the light-blocking pattern) to a depth of about 4 nm.

FIG. 17C shows a difference in intensity between an erroneous hot-spot pattern of which a CD is improved by forming the first corrected area A1 as shown in FIG. 17B and a normal hot-spot pattern. It can be confirmed that a central portion of FIG. 17C is denoted by a dark color because there is little difference in intensity. By improving the CD due to the formation of the first corrected area A1, a difference in intensity between the erroneous hot-spot pattern and the normal hot-spot pattern may be reduced, and the CD of the erroneous hot-spot pattern may be improved.

Figure 18:
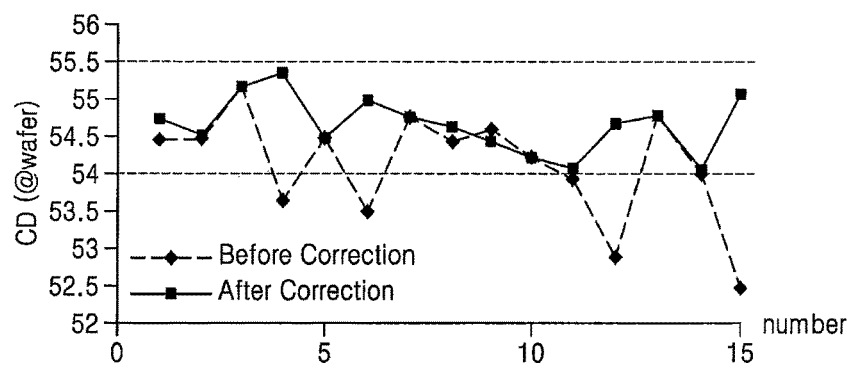
FIG. 18 is a graph showing the distribution of CDs in the hot-spot pattern of FIG. 15 before and after the correction of the CDs.

FIG. 18 is a graph showing the distribution of CDs in the hot-spot pattern of FIG. 15 before and after correction of the CDs. As shown in FIG. 16, in FIG. 18, the abscissa denotes the number of respective patterns, and the ordinate denotes CDs of the respective patterns (nm).

Referring to FIG. 18, a dashed curve shows the CDs of hot-spot patterns before CD correction and is equal to the curve of FIG. 16. A solid curve shows CDs of four hot-spot patterns, which deviate from the target range and are measured again after CD correction.

Referring to FIG. 18, it can be confirmed that all the CDs of four hot-spot patterns that had deviated from the target range were corrected and fell within the target range.

Figure 19:
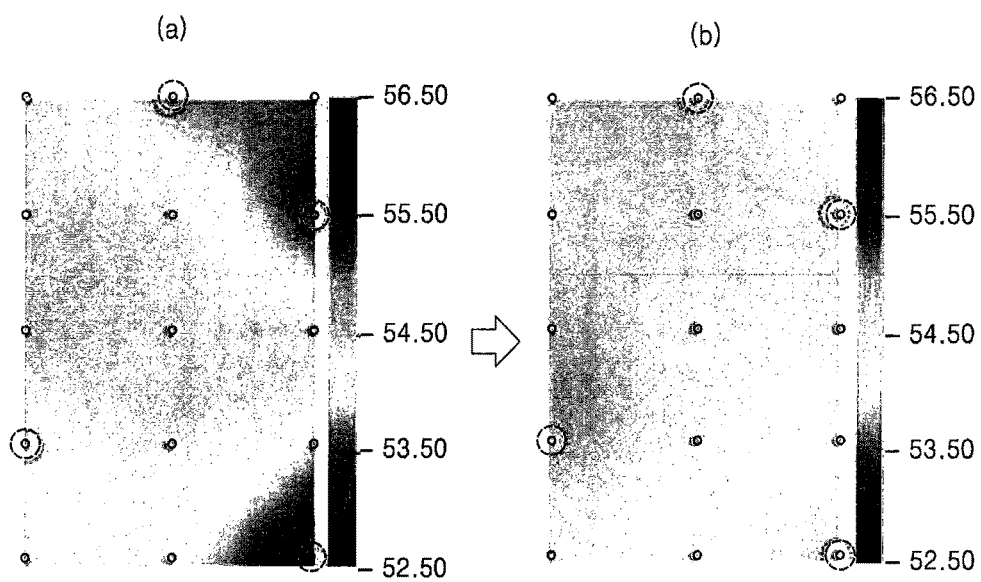
FIG. 19 shows images showing CD uniformity maps of the hot-spot pattern of FIG. 15 before and after CD correction.

FIG. 19 shows images showing CD uniformity maps of the hot-spot patterns of FIG. 15 before and after CD correction.

Referring to FIG. 19, a left image shows a CD uniformity map showing the CD uniformity of hot-spot patterns before the CD correction. In the CD uniformity map, as the CD uniformity deviates more largely from the target range or a target CD (54.50 nm), color darkens, while as the CD uniformity approaches the target CD, color lightens. Referring to the left image of FIG. 19, it can be seen that four points of hot-spot patterns illustrated with dashed circles are denoted by a relatively dark color and deviate from the target range or greatly differ from the target CD. Also, a distribution control range may be determined to be about 2.17 nm on the basis of 3σ (sigma). Here, σ denotes a standard deviation. In a normal distribution, 99.7% may be included in the range of an average to 3σ, and 0.3% may be included in the other range.

A right image shows a CD uniformity map showing the CD uniformity of the hot-spot patterns after the CD correction. Referring to the right image of FIG. 19, it can be seen that CDs of four points of the four hot-spot patterns that had deviated from the target range were improved as denoted by a very light color. That is, it can be confirmed that the CDs of the four points of the hot-spot patterns were corrected and fell into the target range.

In addition, a distribution control range may be determined to be about 1.1 nm on the basis of 3σ. Thus, it can be seen that the distribution control range was improved by almost 50%, as compared with the distribution control range obtained before the CD correction.

FIGS. 20A to 20F are cross-sectional views illustrating a method of fabricating a photomask, according to example embodiments of the inventive concept.

Figure 20A:
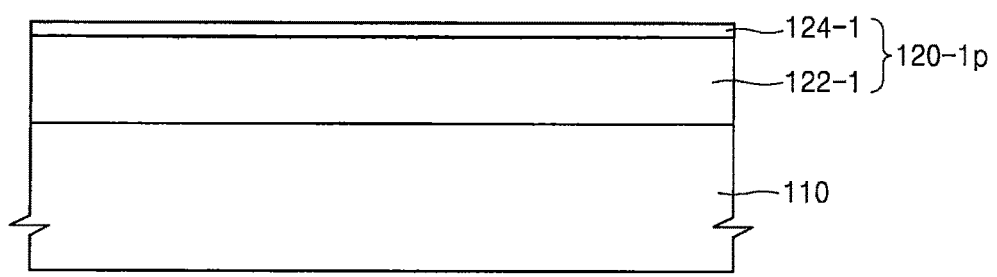
FIGS. 20A to 20F are cross-sectional views illustrating a method of fabricating a photomask according to example embodiments of the inventive concept.

Referring to FIG. 20A, a light-blocking layer 120-1P may be formed by sequentially forming an absorber layer 122-1 and an ARC layer 124-1 on a substrate 110. In some embodiments, the light-blocking layer 120-1P may be formed on the entire surface of the substrate 110. The substrate 110 may be formed of a light transmissive material, for example, glass or quartz. In some embodiments, the substrate 110 may be formed of quartz.

The absorber layer 122-1 may be formed of an opaque material and serve to absorb incident light. For example, the absorber layer 122-1 may be formed of an opaque inorganic material containing silicon or at least one of metals including Cr, CrO, Ni, Cu, Mo, Al, Ti, Ta, W, and Ru, or a compound thereof. Also, the absorber layer 122-1 may be formed of an alloy of the opaque inorganic material and at least one of the metals. In some embodiments, the absorber layer 122-1 may be formed of Cr or an alloy of Si and Mo. Also, the absorber layer 122-1 may be formed to a thickness of, for example, about 50 to 80 nm.

The ARC layer 124-1 may serve to reduce or possibly prevent reflection of incident light and be formed to a very small thickness of about several nm. The ARC layer 124-1 may be formed of, for example, SiN, SiO, SiON, MoSiN, MoSiO, MoSiON, or TiN. Also, the ARC layer 124-1 may be formed of amorphous carbon, organic ARC, or inorganic ARC. When the absorber layer 122-1 has a very low reflection rate, the ARC layer 124-1 may be omitted. When the ARC layer 124-1 is omitted, the absorber layer 122-1 may function as the light-blocking layer 120-1$p$.

Figure 20B:
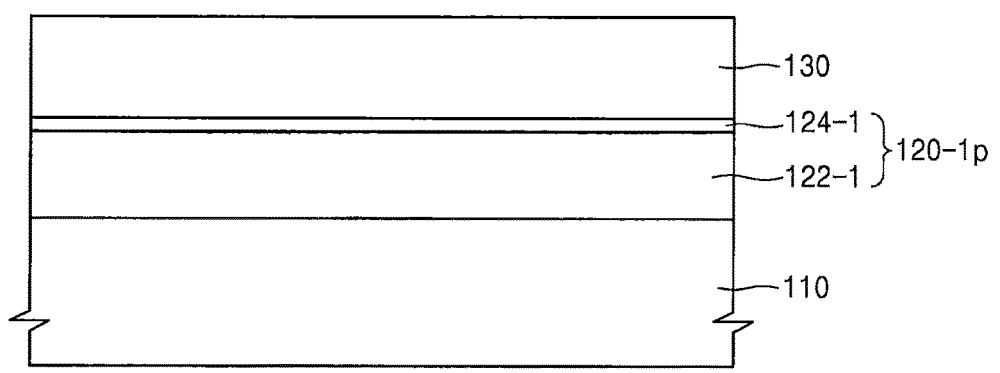

Referring to FIG. 20B, a photoresist layer 130 may be formed on the light-blocking layer 120-1$p$. The photoresist layer 130 may be a material layer that may react with a light source and be patterned. In some embodiments, the light source may be e-beams, and the photoresist layer 130 may be e-beam resist. It will be understood that the light source is not limited to e-beams. For example, the light source may be FIBs or laser beams. When the light source is FIBs or laser beams, a material of the photoresist layer 130 may be changed accordingly.

Figure 20C:
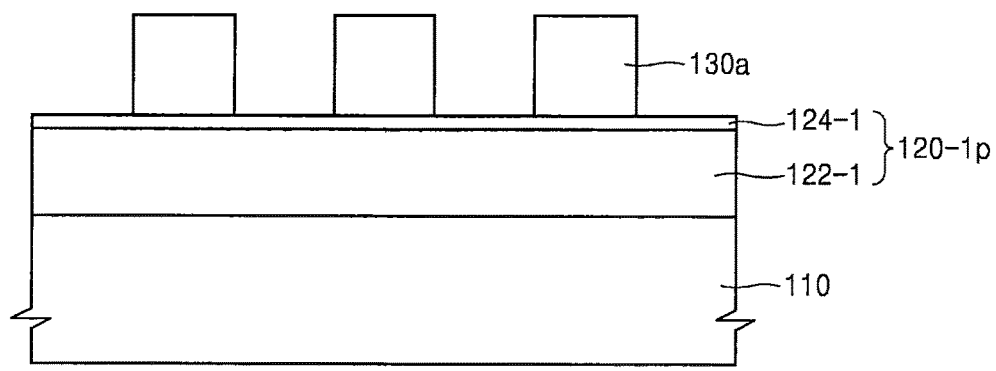

Referring to FIG. 20C, the photoresist layer 130 may be exposed using, for example, e-beams and developed to form a photoresist pattern 130a. The photoresist pattern 130a may be formed to an appropriate width at appropriate intervals in consideration of a light-blocking pattern to be formed thereunder.

Figure 20D:
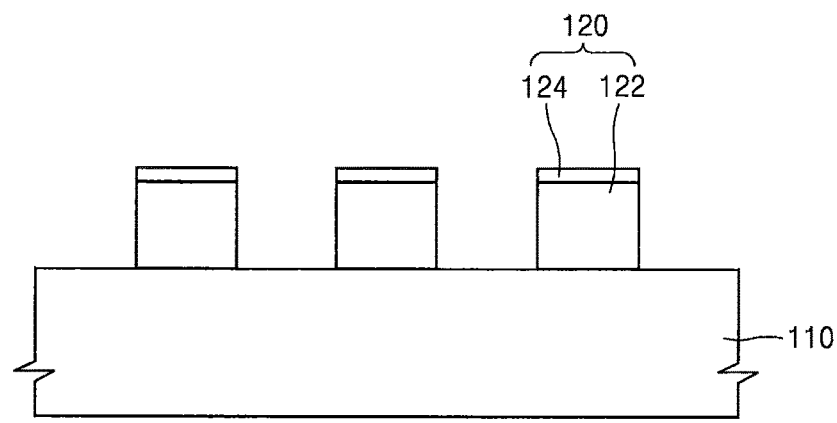

Referring to FIG. 20D, the light-blocking layer 120-1$p$ may be patterned using the photoresist pattern 130a as an etch mask, thereby forming a light-blocking pattern 120. When the absorber layer 122-1 is formed of Cr, the light-blocking layer 120-1$p$ may be patterned using an etch gas containing a chlorine (Cl—) group or a fluorine (F—) group. More specifically, a combination of gases, such as $Cl_2$, $BCl_3$, $SiCl_4$, and HBr, may be used as the etch gas. In other cases, the light-blocking layer 120-1p may be patterned using an acidic etchant, such as nitric acid.

When the ARC layer 124-1 is disposed on the absorber layer 122-1, the ARC layer 124-1 may be etched along with the absorber layer 122-1 or etched using an additional etching process. For example, when the ARC layer 124-1 is formed of an organic component, the ARC layer 124-1 may be etched by adding a fluorine-containing compound gas, such as $CHF_3$, $CF_4$, and $C_2F_6$, to $O_2$ or $N_2$. Also, when the ARC layer 124-1 is formed of an inorganic component, the ARC layer 124-1 may be etched using $O_2$ gas and $CF_4$ gas alone or in a combination thereof, or etched using $Cl_2$ gas or a mixture of $Cl_2$ gas and $N_2$ gas.

After the light-blocking pattern 120 is formed, the photoresist pattern 130a may be removed. The photoresist pattern 130a may be removed by means of a dry removal process using oxygen ($O_2$) gas or a wet removal process using sulfuric acid ($H_2SO_4$).

Figure 20E:
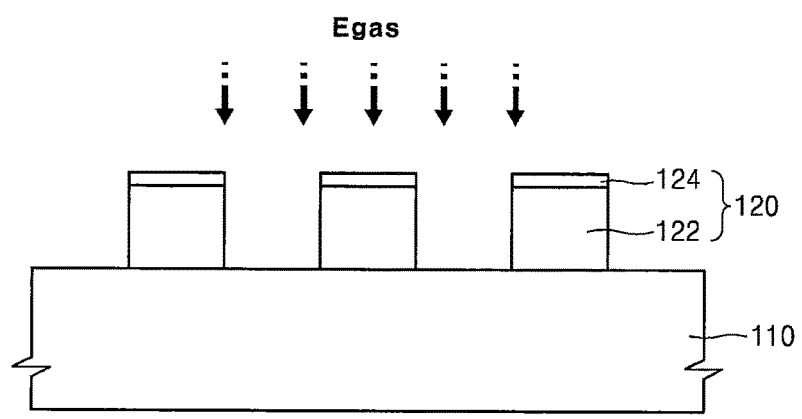

Referring to FIG. 20E, an etch gas Egas may be sprayed onto the substrate 110, in some embodiments onto the entire surface of the substrate 110, on which the light-blocking pattern 120 is formed. The etch gas Egas, which is a gas containing a halogen element, may be, for example, a gas containing fluorine (F), chlorine (Cl), bromine (Br), or iodine (I). The etch gas Egas may be appropriately selected according to a material forming an etch target layer. For example, when the etch target layer is formed of Cr or CrO, a chlorine-containing gas, such as $CCl_4$, $C_2Cl_4$, or $C_2H_2Cl_2$, or a fluorine-containing gas, such as $CF_4$ or $XeF_2$, may be used as the etch gas Egas. The sprayed etch gas Egas, which is in an inert state, may be diffused onto the surfaces of the general light-blocking pattern 120 and the substrate 110 and adsorbed as a monolayer type.

Figure 20F:
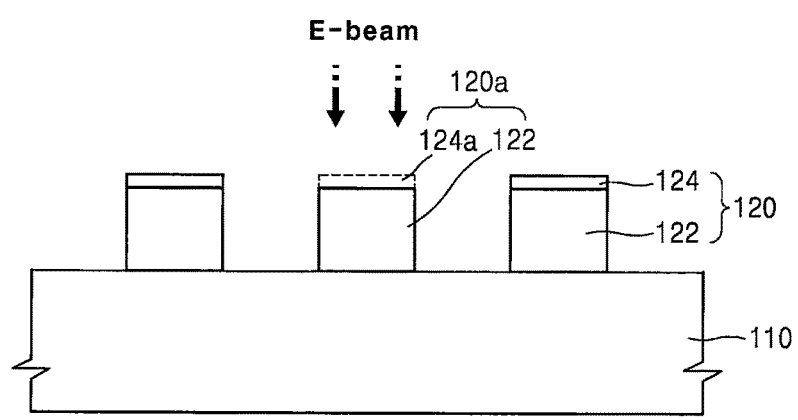

Referring to FIG. 20F, e-beams may be irradiated onto a top surface of the general light-blocking pattern 120 of which a CD needs to be corrected. When the e-beams are irradiated, the etch gas Egas adsorbed on an irradiated region may be dissociated due to the e-beams and activated. The activated etch gas Egas (e.g., halogen element) may react with the general light-blocking pattern 120 and be modified into a volatile gas so that part of the top surface of the general light-blocking pattern 120 can be removed by etching to a predetermined thickness.

A first corrected area (e.g., A1 of FIG. 1) may be formed by etching a portion of the top surface of the general light-blocking pattern 120 to a predetermined thickness so that a corrected light-blocking pattern 120a including the first corrected area A1 can be formed. As described above, a final photomask may be completely manufactured by forming the corrected light-blocking pattern 120a. The final photomask may be a photomask of which a CD is corrected in the range of several nm or less. Thus, the final photomask may be a photomask throughout which the distribution of CDs may be markedly improved. Although an etching method using e-beams has been described above, FIBs may be used instead of the e-beams. In some embodiments, laser beams may be used.

Figure 21A:
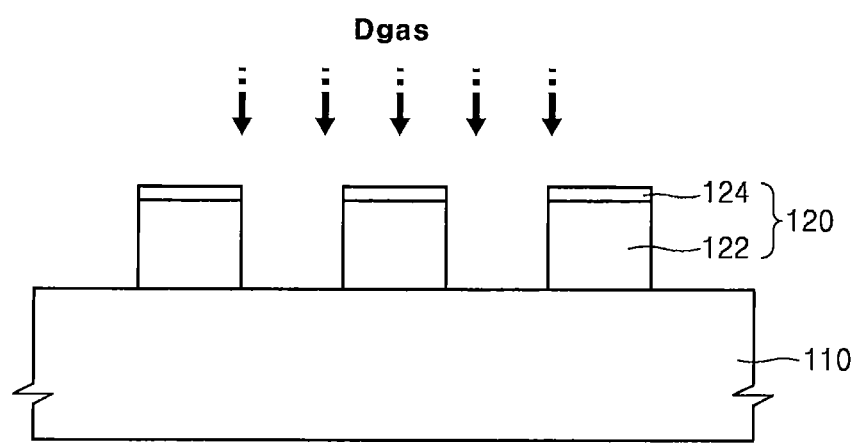
FIGS. 21A and 21B are cross-sectional views illustrating a method of fabricating a photomask according to example embodiments of the inventive concept.
Figure 21B:
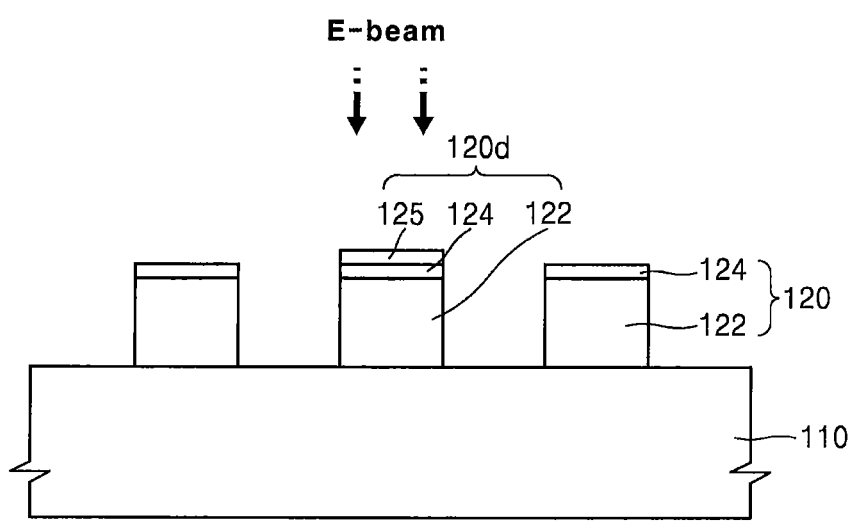

FIGS. 21A and 21B are cross-sectional views illustrating a method of fabricating a photomask, according to example embodiments of the inventive concept. FIG. 21A may correspond to FIG. 20E, and FIG. 21B may correspond to FIG. 20F.

Referring to FIG. 21A, a deposition gas Dgas, which is in an inert state, may be sprayed onto a substrate 110 on which a light-blocking pattern 120 is formed. In some embodiments, the deposition gas Dgas may be spayed onto the entire surface of the substrate 110. The deposition gas Dgas may be gas containing elements of a material layer to be formed. For example, when the material layer to be formed is a metal layer formed of metals, such as gold (Au), aluminum (Al), titanium (Ti), or chromium (Cr), gas containing the metals may be used as the deposition gas Dgas. For example, when the material layer to be formed is a chromium metal layer, $Cr(CO)_6$ gas may be used as the deposition gas Dgas. Also, when the material layer to be formed is a silicon compound containing silicon or a carbon compound containing carbon (C), a gas containing silicon or carbon may be used as the deposition gas Dgas. The sprayed deposition gas Dgas, which is in an inert state, may be diffused onto the surfaces of the general light-blocking pattern 120 and the substrate 110 and adsorbed as a monolayer type.

Referring to FIG. 21B, e-beams may be irradiated onto a top surface of the general light-blocking pattern 120 of which a CD needs to be corrected. When the e-beams are irradiated, the deposition gas Dgas adsorbed onto the radiated region may be dissociated due to the e-beams and activated. The activated deposition gas Dgas may react or combine with the general light-blocking pattern 120 to form a material layer. Thus, a correction layer 125 may be formed to a predetermined thickness on the top surface of the general light-blocking pattern 120.

A second corrected area (e.g., A2 in FIG. 7A), in which the correction layer 125 is formed on the top surface of the general light-blocking pattern 120 to a predetermined thickness, may be formed so that a correction light-blocking pattern 120d including the second corrected area A2 can be formed. Thus, a final photomask may be completed by forming the correction light-blocking pattern 120d. The final photomask may be a photomask of which a CD is corrected in the range of several nm or less. Thus, the final photomask may be a photomask throughout which the distribution of CDs may be markedly improved.

Figure 22:
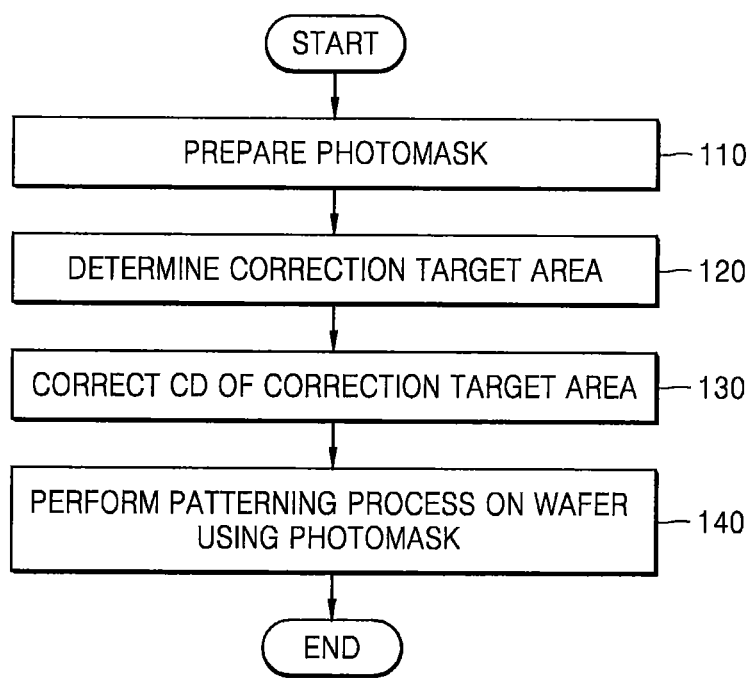
FIG. 22 is a flowchart of a method of fabricating a semiconductor device according to example embodiments of the inventive concept.

FIG. 22 is a flowchart of a method of fabricating a semiconductor device, according to example embodiments of the inventive concept.

Referring to FIG. 22, a photomask may be prepared (Block 110). Here, the photomask may refer to a photomask including only general light-blocking patterns 120 formed on a substrate 110. That is, the photomask may not include a first corrected area or a second corrected area.

A correction target area may be determined (Block 120). The determination of the correction target area may include determining a region of which a CD is to be corrected. The determination of the corrected target region may include transferring a pattern on a wafer by using the photomask, detecting a region in which many errors occur (i.e., a hot-spot area) by inspecting patterns formed on the wafer, and determining a portion of the photomask corresponding to the hot-spot area as the correction target area. Also, a pattern image of the photomask relative to a transmission intensity may be generated and analyzed using an AIMS apparatus to detect the hot-spot area, which is weak in patterning margins, and the hot-spot area may be determined as the correction target area.

When the correction target area is determined, a CD of the correction target area may be corrected (Block 130). As described with reference to FIGS. 11A to 11C, correcting the CD of the correction target area may include forming a first corrected area by removing part of a top surface of the general light-blocking pattern 120 of the correction target area by using an etching process. Also, as described with reference to FIGS. 12A to 12C, correcting the CD of the correction target area may include forming a second corrected area by forming a correction layer on the top surface of the general light-blocking pattern of the correction target area.

Various photomasks shown in FIGS. 1 to 6C or FIG. 10A may be embodied using the method of forming the first corrected area. Also, photomasks shown in FIGS. 7A to 8C or FIG. 10B may be embodied using the method of forming the second corrected area. Furthermore, the photomask shown in FIG. 9 may be embodied by forming both the first corrected area and the second corrected area on the photomask.

After the CD of the correction target area is corrected, a patterning process may be performed on the wafer by using the photomask of which a CD is corrected (Block 140). Performing the patterning process on the wafer may include forming a photoresist pattern by performing exposure and developing processes using the photomask, and patterning an underlying material layer using the photoresist pattern as a mask. In some embodiments, correcting the CD of the correction target area may be immediately followed by patterning the wafer. In some embodiments, patterning the wafer may be performed after a predetermined time interval lapsed after correcting the CD of the correction target area.

Subsequently, various semiconductor processes, such as an interconnection process and a patterning process, may be performed, thereby completing the manufacture of a semiconductor device. In addition, before performing the patterning process on the wafer, various processes, such as an impurity doping process and a material layer depositing process, may be further performed on the wafer.

In a method of fabricating a semiconductor device, according to the present embodiment, a patterning process may be performed on a wafer by using a photomask in which the distribution of CDs may be markedly improved by correcting the CDs. Thus, high-quality patterns may be formed on the wafer at a low error rate. As a result, the performance and mass productivity of the semiconductor device may be remarkably enhanced.

While the inventive concept has been particularly shown and described with reference to example embodiments thereof, it will be understood that various changes in form and details may be made therein without departing from the spirit and scope of the following claims.

What is claimed is:

1. A method of fabricating a photomask, the method comprising:
    forming an absorber layer on a substrate;
    forming a light-blocking pattern by patterning the absorber layer; and
    correcting a critical dimension (CD) of the light-blocking pattern in a correction target area by removing an upper portion of the light-blocking pattern in the correction target area.

2. The method of claim 1, wherein correcting the CD of the light-blocking pattern in the correction target area comprises:
    spraying an etch gas onto the light-blocking pattern; and then
    irradiating electronic beams (e-beams) onto an upper surface of the light-blocking pattern in the correction target area to remove the upper portion of the light-blocking pattern in the correction target area.

3. The method of claim 1 further comprising forming an anti-reflection coating (ARC) layer on the absorber layer, wherein forming the light-blocking pattern further comprises patterning the ARC layer.

4. The method of claim 3, wherein correcting the CD of the light-blocking pattern in the correction target area comprises exposing a top surface of the absorber layer by removing a portion of the ARC layer in the correction target area.

5. The method of claim 1, wherein the CD of the light-blocking pattern in the correction target area increases by removing the upper portion of the light-blocking pattern in the correction target area.

6. The method of claim 1, wherein correcting the CD of the light-blocking pattern in the correction target area comprises removing the upper portion of the light-blocking pattern in the correction target area by using an etching process using electronic beams (e-beams) or focused ion beams (FIBs), a plasma etching process and/or a sputtering etching process.

7. The method of claim 1, wherein the light-blocking pattern protrudes from the substrate in a vertical direction, and
    wherein removing the upper portion of the light-blocking pattern in the correction target area reduces a thickness of the light-blocking pattern in the correction target in the vertical direction.

8. The method of claim 7, wherein the thickness of the light-blocking pattern in the correction target reduced by removing the upper portion of the light-blocking pattern in the correction target area is about 10 nm or less.

9. A method of forming a photomask comprising:
    forming an absorber layer on a substrate;
    forming a light-blocking pattern by patterning the absorber layer; and
    forming a corrected area in the light-blocking pattern by removing an upper portion of the light-blocking pattern in the corrected area or by forming a correction layer on the light-blocking pattern in the corrected area, the correction layer and the absorber layer comprising a same material.

10. The method of claim 9, wherein a first thickness of the upper portion of the light-blocking pattern removed or a second thickness of the correction layer is about 10 nm or less.

11. The method of claim 9, wherein forming the corrected area in the light-blocking pattern comprises providing a reaction gas on a surface of the light-blocking pattern and then providing an irradiating electronic beam on a portion of the surface of the light-blocking pattern in the corrected area to remove the upper portion of the light-blocking pattern in the corrected area or to form the correction layer on the light-blocking pattern in the corrected area.

12. The method of claim 9 further comprising forming an anti-reflection coating (ARC) layer on the absorber layer before patterning the absorber layer,
    wherein forming the light-blocking pattern comprises sequentially patterning the ARC layer and the absorber layer, and
    wherein removing the upper portion of the light-blocking pattern in the corrected area comprises removing a portion of the ARC layer that is in the corrected area such that an upper surface of the absorber layer is exposed in the corrected area.

13. The method of claim 9, wherein forming the corrected area in the light-blocking pattern by removing the upper portion of the light-blocking pattern in the corrected area further comprises recessing a sidewall of the light-blocking pattern in the corrected area.

14. The method of claim 9 further comprising forming an anti-reflection coating (ARC) layer on the absorber layer before patterning the absorber layer, wherein forming the light-blocking pattern comprises sequentially patterning the ARC layer and the absorber layer, and wherein forming the correction layer on the light-blocking pattern in the corrected area comprises forming the correction layer on the ARC layer such that the ARC layer is between the absorber layer and the correction layer.

15. The method of claim 9, wherein forming the corrected area in the light-blocking pattern by forming the correction layer on the light-blocking pattern in the corrected area further comprises forming the correction layer on a side of the light-blocking pattern in the corrected area.

16. The method of claim 9, wherein the absorber layer and the correction layer comprise chromium (Cr), and/or wherein the absorber layer comprises an alloy containing molybdenum (Mo) and silicon (Si), and the correction layer comprises an alloy containing molybdenum and silicon or silicon.

17. The method of claim 9, wherein the light-blocking pattern protrudes from the substrate in a vertical direction, and wherein removing the upper portion of the light-blocking pattern in the corrected area reduces a thickness of the light-blocking pattern in the corrected area in the vertical direction.

18. The method of claim 9, wherein a lower portion of the light-blocking pattern in the corrected area remains after removing the upper portion of the light-blocking pattern in the corrected area.

19. The method of claim 9, wherein forming the correction layer on the light-blocking pattern in the corrected area comprises:

providing a deposition gas on a top surface of the light-blocking pattern; and then irradiating electronic beams (e-beams) onto the top surface of the light-blocking pattern in the corrected area to form the correction layer.

20. The method of claim 9 further comprising forming an anti-reflection coating (ARC) layer on the absorber layer before forming the light-blocking pattern, wherein forming the light-blocking pattern comprises sequentially patterning the ARC layer and the absorber layer, and wherein forming the correction layer on the light-blocking pattern in the corrected area comprises forming the correction layer on a top surface of the ARC layer in the corrected area.

* * * * *